United States Patent
Balma

(10) Patent No.: US 12,435,931 B2
(45) Date of Patent: Oct. 7, 2025

(54) RADIATIVE HEATSINK

(71) Applicant: Maxwell Labs Inc., Saint Paul, MN (US)

(72) Inventor: Jacob A. Balma, Lino Lakes, MN (US)

(73) Assignee: Maxwell Labs Inc., Saint Paul, MN (US)

( * ) Notice: Subject to any disclaimer, the term of this patent is extended or adjusted under 35 U.S.C. 154(b) by 247 days.

(21) Appl. No.: 18/153,782

(22) Filed: Jan. 12, 2023

(65) Prior Publication Data

US 2023/0221083 A1    Jul. 13, 2023

Related U.S. Application Data

(60) Provisional application No. 63/299,187, filed on Jan. 13, 2022.

(51) Int. Cl.
*F28F 3/04* (2006.01)
*F28F 13/18* (2006.01)
(Continued)

(52) U.S. Cl.
CPC ............... *F28F 3/04* (2013.01); *F28F 13/18* (2013.01); *F28F 21/04* (2013.01);
(Continued)

(58) Field of Classification Search
CPC ........ F28F 3/02; F28F 3/04; F28F 3/08; F28F 13/18; F28F 21/04; F28F 2245/06;
(Continued)

(56) References Cited

U.S. PATENT DOCUMENTS 5,349,821 A    9/1994  Schrage
6,711,904 B1   3/2004  Law et al.
(Continued)

FOREIGN PATENT DOCUMENTS

CN    107256615 A    10/2017
WO    2008088306 A2   7/2008

OTHER PUBLICATIONS

Lin, Shawn-Yu, et al. "An in-Situ and Direct Confirmation of Super-Planckian Thermal Radiation Emitted from a Metallic Photonic-Crystal at Optical Wavelengths." Scientific Reports (Nature Publisher Group) vol. 10, No. 1, (Year: 2020).*

(Continued)

*Primary Examiner* — Eric S Ruppert
*Assistant Examiner* — Hans R Weiland
(74) *Attorney, Agent, or Firm* — Lee Sullivan Shea & Smith LLP

(57) ABSTRACT

A radiative heatsink includes a cold plate, a radiator mounted to the cold plate and a thermal compound located between and coupling the heat source to the cold plate. The thermal compound converts a portion of a first phononic thermal energy from the heat source into a first photonic near-field and a first photonic far-field thermal radiation and transfers the first photonic near-field, the first photonic far-field and the remaining of the first phononic thermal energy to the cold plate. The cold plate combines the first photonic near-field, the first photonic far-field and the remaining first phononic thermal energy into a second phononic thermal energy and provides the second phononic thermal energy to the radiator. The radiator converts the second phononic thermal energy into a second photonic near-field and a second photonic far-field and emits the second photonic near-field or the second photonic far-field such that cold plate is regenerated.

19 Claims, 18 Drawing Sheets

(51) Int. Cl.
*F28F 21/04* (2006.01)
*H05K 7/20* (2006.01)

(52) U.S. Cl.
CPC ..... *H05K 7/20409* (2013.01); *H05K 7/20481* (2013.01); *H05K 7/20709* (2013.01)

(58) Field of Classification Search
CPC .. H01S 5/02438; H01S 5/02469; H01S 5/125; H05K 7/20409; H05K 7/20481; H05K 7/20709
See application file for complete search history.

(56) References Cited

U.S. PATENT DOCUMENTS

| | | | |
|---|---|---|---|
| 10,641,172 | B2 | 5/2020 | Jones et al. |
| 11,435,766 | B2 | 9/2022 | Balma |
| 2004/0233641 | A1 | 11/2004 | Moshayedi |
| 2005/0067158 | A1 | 3/2005 | Ito et al. |
| 2005/0091989 | A1 | 5/2005 | Leija et al. |
| 2005/0134827 | A1 | 6/2005 | Box et al. |
| 2006/0120036 | A1 | 6/2006 | Rockenfeller |
| 2008/0170982 | A1 | 7/2008 | Zhang et al. |
| 2009/0321909 | A1 | 12/2009 | Gu et al. |
| 2014/0312828 | A1 | 10/2014 | Vo et al. |
| 2017/0047889 | A1* | 2/2017 | Atwater ................. B64G 1/503 |
| 2017/0317642 | A1* | 11/2017 | O'Neill ................. H10F 77/484 |
| 2020/0081464 | A1 | 3/2020 | Balma |
| 2021/0190382 | A1* | 6/2021 | Mohamad ............... F24S 80/56 |
| 2022/0365548 | A1 | 11/2022 | Balma |

OTHER PUBLICATIONS

Notification of Transmittal of the International Search Report and the Written Opinion of the International Search Authority, or the Declaration dated Apr. 26, 2023 for corresponding PCT application Serial No. PCT/US2023/010764, 6 pages.

Written Opinion dated Apr. 26, 2023 for corresponding PCT application Serial No. PCT/US2023/010764, 11 pages.

Lin et al., A three-dimensional photonic crystal operating at infrared wavelengths, Nature, Nature Publishing Group UK, London, vol. 394, No. 6690, pp. 251-253, 1998.

Lin et al., An in-situ and direct confirmation of super-planckian thermal radiation emitted from a metallic photonic-crystal at optical wavelengths, vol. 10, No. 1, 7 pages, 2020.

International Search Report and Written Opinion mailed Dec. 6, 2019 for International Application No. PCT/US2019/050167 filed Sep. 9, 2019, 11 pages.

* cited by examiner

RADIATIVE HEATSINK

CROSS-REFERENCE TO RELATED APPLICATION

The present application is based on and claims the benefit of U.S. provisional patent application Ser. No. 63/299,187, filed Jan. 13, 2022, the content of which is hereby incorporated by reference in its entirety.

BACKGROUND

Photons and phonons are two fundamental carriers of thermal energy in and between materials. Photons are thermally-excited waves of electromagnetic fields, while phonons are waves of oscillatory atomic kinetic vibrational energy. Photons can be classified as either existing in the near-field (NF) of the source (i.e., photons existing as excitations of the electromagnetic field within one wavelength of the surface) or far-field (FF) of the source (i.e., photons existing as excitations of the electromagnetic field beyond one wavelength of the surface). Together photons and phonons give rise to thermal radiation, which corresponds with the conversion of thermal energy into electromagnetic energy and therefore the emission of electromagnetic waves (which propagate as excitations in the electromagnetic field) from an object as a result of its temperature.

All objects with a temperature above absolute zero emit thermal radiation in a spectrum of wavelengths. Infrared radiation or infrared electromagnetic waves are one part of the electromagnetic spectrum and includes near-infrared (NIR), which is approximately 0.8-3 µm in wavelength and nearest to red visible light, mid-infrared (MIR), which is approximately 3-14 µm in wavelength and far-infrared (FIR), which is approximately 14-30 µm in wavelength and nearest to microwave.

The discussion above is merely provided for general background information and is not intended to be used as an aid in determining the scope of the claimed subject matter.

SUMMARY

A radiative heatsink coupled to a heat source includes a cold plate having a thermal reservoir, a radiator mounted to the cold plate and a thermal interface material located between and coupling the heat source to the cold plate. The thermal interface material is configured to convert a portion of a first phononic thermal energy from the heat source into a first photonic near-field thermal radiation and a first photonic far-field thermal radiation and to transfer the first photonic near-field thermal radiation, the first photonic far-field thermal radiation and the remaining of the first phononic thermal energy from the heat source to the bulk material of the cold plate. The bulk material of the cold plate is configured to combine the first photonic near-field thermal radiation, the first photonic far-field thermal radiation and the remaining first phononic thermal energy into a second phononic thermal energy and provide the second phononic thermal energy to the radiator. The radiator is configured to convert the second phononic thermal energy into a second photonic near-field thermal radiation and a second photonic far-field thermal radiation and emit the second photonic near-field thermal radiation or the second photonic far-field thermal radiation such that the thermal reservoir of the bulk material is continuously regenerated.

A radiative heatsink coupled to a heat source includes a radiator configured to emit super-Planckian photonic near-field and far-field thermal radiation from the heat source and comprises a photonic crystal made of a refractory material. The photonic crystal includes a plurality of beams arranged in a woodpile structure. A unit cell includes four layers of beams having a diamond lattice symmetry. The radiator is configured to deposit the super-Planckian photonic near-field and far-field thermal radiation in a working fluid.

A radiative heatsink coupled to a heat source includes a cold plate including a bulk material having a thermal reservoir, a radiator mounted to the cold plate and a compound located between and coupling the heat source to the cold plate. The radiator comprises a photonic crystal made of a refractory material including a plurality of beams arranged in a woodpile structure. Four layers of beams include a unit cell having diamond lattice symmetry. The thermal compound is configured to produce super-Planckian thermal radiation from the heat source to be absorbed and transmitted by the bulk material of the cold plate. The radiator is configured to emit super-Planckian near-field and far-field thermal radiation such that the thermal reservoir of the bulk material is continuously regenerated.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Figure 1:
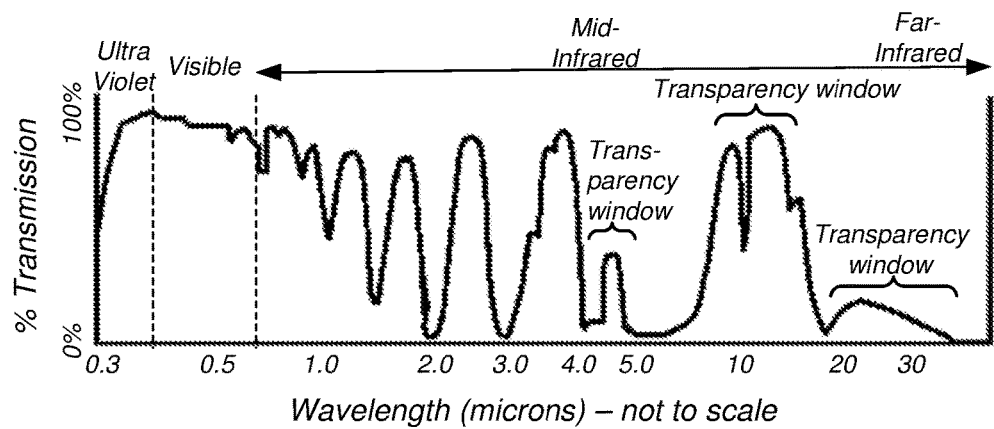
FIG. 1 illustrates a diagram of a portion of the electromagnetic spectrum including the transmittance of a subset of electromagnetic energy at various wavelengths.

FIG. 1 illustrates a diagram of a portion of the electromagnetic spectrum including the transmittance of a subset of electromagnetic energy or photons at various wavelengths. Infrared radiation is a type of energy that is invisible to the human eyes, but is sensed as heat or thermal radiation. FIG. 1 illustrates sections of the infrared range including a reflected or near-field infrared and far-field infrared.

As illustrated in FIG. 1, the earth's atmosphere generally has three atmospheric transparency windows in the infrared range where energy transmits freely through the atmosphere into outer space including atmospheric transparency windows in the 4-5 µm wavelength spectral range, 8-13 µm wavelength spectral range, and 16-26 µm wavelength spectral range. These transparency windows may be utilized for pumping heat or energy into an effective heatsink provided by outer space. This is called radiative cooling. Both nighttime and daytime radiative cooling technologies have been developed with the express goal of keeping a surface below the temperature of ambient air. Daytime radiative cooling is technically feasible, but relies on highly reflective substrates to prevent absorption of incident solar radiation.

One of the main benefits of employing radiative cooling technologies within computer servers is that they are already shielded from incident solar radiation, and the main source of heat that drives the radiative effects comes from the kinetic transfer of thermal energy from the server components. Server components themselves are composed of a combination of plastic, metallic and semiconductor materials. These materials vary in their transmittance of the relevant wavelengths, but careful consideration of infrared window placement in a server housing and materials used in construction of datacenters and the enclosures themselves can allow much of the energy within these ranges to pass through with minimal attenuation.

Embodiments of various proposed radiative heatsink devices allow for the incorporation of multiple radiative cooling technologies into a single device. Passive radiative heatsink devices include the engineering of surface properties of a bulk heatsink material and its component parts to provide a heatsink device that includes a thermal metasurface framework in combination with particular geometries that provide a sky-facing surface area. By controlling simultaneously the spectral range over which the bulk heatsink material radiates, the geometry and scale of the surface patterning, and the topology of the passive radiative heatsink device itself, it is possible to adjust the spatial and temporal coherence, directionality and focal point of the radiation that the device emits.

By employing metamaterial design techniques, precise control of the density, absorption, transmittance and reflectance properties of bulk heatsink materials is possible. These features, when combined with careful design of the topology and narrow-band emissivity within the atmospheric transparency windows, allows a radiative heatsink device to serve as the basis for an entirely new class of thermal management solutions.

Figure 2:
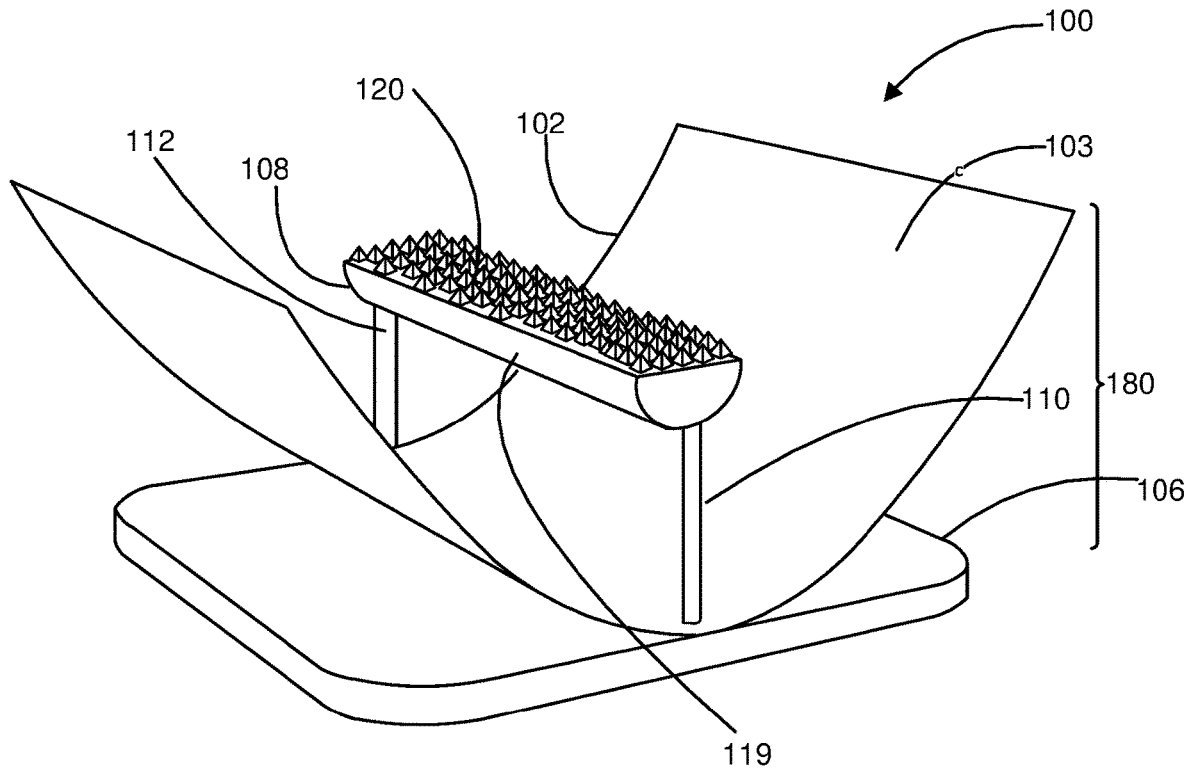
FIG. 2 illustrates a perspective view of a passive radiative heatsink device configured to be coupled to a heat source according to an embodiment.

FIG. 2 illustrates a perspective view of a passive radiative heatsink device 100 that is configured to be coupled to a heat source according to an embodiment. Device 100 includes a radiator 180 having a concave parabolic fin or emitter 102 and a concentrator rod 108 and a cold plate 106. A central focal plane of concave parabolic fin or emitter 102 is centered on and is coupled to a top surface of cold plate 106 such that the concave surface of parabolic fin or emitter 102 is facing upwards toward concentrator rod 108. Concentrator rod 108 is spaced apart from concave parabolic fin or emitter 102 and may be shaped like a halfpipe including having a convex-shaped lower surface 119 and an upper planar side or emitter plane 120. A bottom surface of cold plate 106 is configured to attach to a heat source.

In one embodiment, concentrator rod 108 is mounted on a pair of support bars 110 and 112 that protrude from opposing ends of an upper concave surface 103 of the central focal plane of concave parabolic fin 102. In this way, concentrator rod 108 is spaced apart from upper surface 103 of parabolic fin or emitter 102 and oriented widthwise along the central focal plane of the parabolic fin 102. However, it should be realized that other structural features other than a pair of support bars 110 and 112 may be used for spacing concentrator rod 108 away from upper concave surface 103 of parabolic fin or emitter 102 are possible. Opposing magnetic fields may be used to levitate the concentrator rod relative to the support bars, or the optical coupling itself might serve to balance or suspend the concentrator rod.

Figure 3:
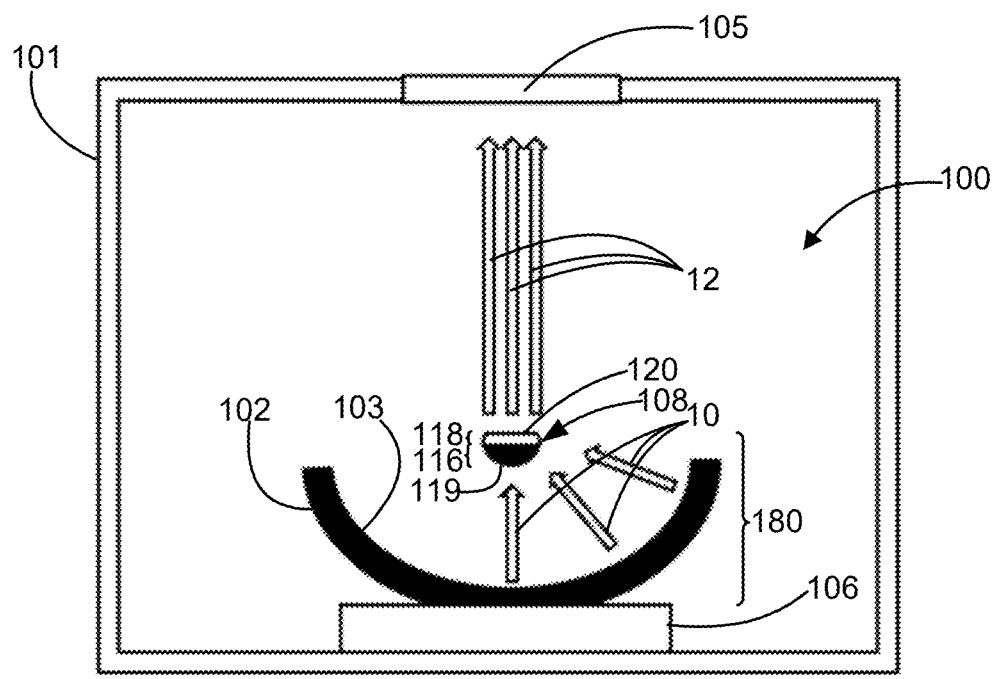
FIG. 3 illustrates a schematic diagram of the passive radiative heatsink device of FIG. 2.

FIG. 3 illustrates a schematic diagram of passive radiative heatsink device 100. As illustrated, concentrator rod 108 includes a lower portion 116 having the convex-shaped lower surface 119 and an opposing upper portion 118 having upper planar side or emitter plane 120. Under one embodiment and as illustrated in FIG. 3, convex-shaped lower surface 119 of lower portion 116 provides a focal point for thermal energy or coherent infrared radiation 10 leaving concave parabolic fin or emitter 102 to be concentrated. Upper planar side of emitter plane 120 defines a top of upper portion 118 of concentrator rod 108 and includes a surface, such as a thermal metasurface, to collimate, focus and tune the concentrated thermal radiation 12 away from the heat source and into an upper optical coupling for routing into fiber optic bundle or line-of-sight optics. Concentrated thermal radiation 12 may also exit through a window, lens or absorber 105 in a casing 101 that surrounds passive radiative heatsink device 100. For example, casing 101 may be a server casing that surrounds passive radiative heatsink device 100 and components of a computer server that provide a heat source. If element 105 is a window or lens, concentrated thermal radiation 12 will leave the casing and if element 105 is an absorber, concentrated thermal radiation 12 is deposited into a thermophotovoltaic, photovoltaic, or thermoelectric generator element coupled to an electrical energy storage system, such as a battery or capacitor, where the thermal energy carried by the radiation is converted by the photovoltaic or thermoelectric generator element, directly into electrical energy and stored for later use. Alternatively, the thermal energy might be deposited directly into the server casing 101.

Figure 4:
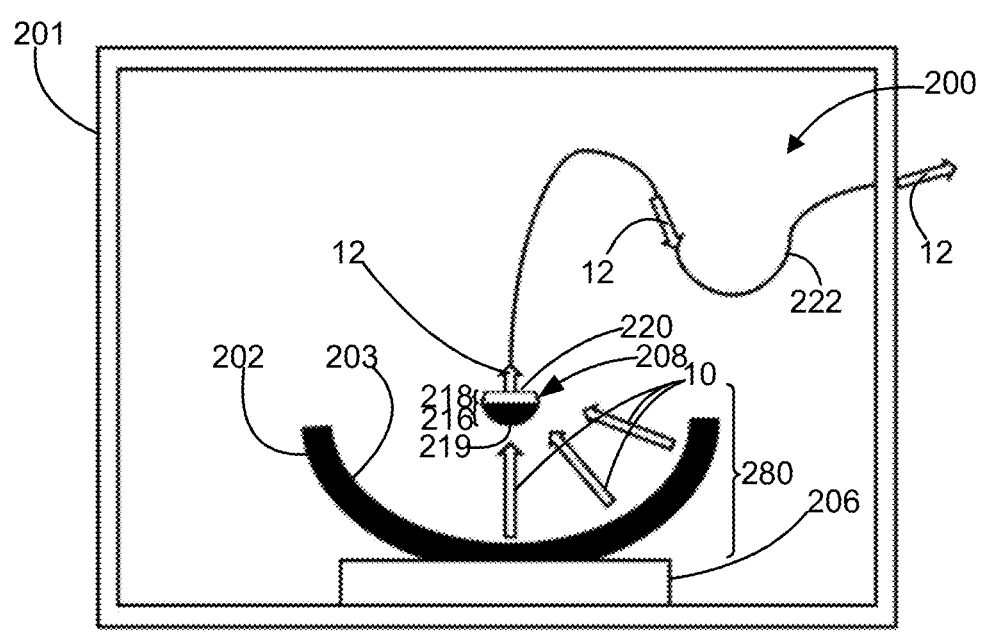
FIG. 4 illustrates a schematic diagram of a passive radiative heatsink device according to another embodiment.

FIG. 4 illustrates a schematic diagram of a passive radiative heatsink device 200 according to another embodiment. Passive heatsink device 200 includes a radiator 280. In FIG. 4, concentrator rod 208 is configured to connect metallic "light pipes" or fiber optic cables which carry concentrated thermal infrared energy or emitted thermal radiation 12 away from the heat source and device 200 and outside of casing 201. Lower portion 216 of concentrator rod 208 having convex-shaped lower surface 219 absorbs coherent infrared radiation 10 from concave surface 203 of concave parabolic fin or emitter 202, and upper portion 218 including upper planar side 220 that defines a top of upper portion 218 and has a surface, such as a thermal metasurface, converts absorbed energy 10 into wavelengths of concentrated thermal radiation 12, such as concentrated infrared thermal radiation, that can be reliably transmitted through pipes or optical fiber. Once concentrated radiation 12 is directed to a boundary of casing 201 and the environment outside of casing 201, it can then be emitted uniformly from the illustrated exit point using optical dispersion techniques.

In the embodiments illustrated in FIGS. 2-3 and 4, directionality in space may be controlled by the thermal metasurface of upper planar sides or emitter planes 120 and 220 of concentrator rod 108 and 208. A thermal metasurface is any surface of a material which has been functionalized to support integrated optical controls via the addition of sub-wavelength surface features. These features may be geometric in nature, controlled via etching, lithography or related patterning techniques employed on a substrate. In the alternative, a thermal metasurface may be added as nano/micro particle dopants, embedded in a bulk material matrix. The surface of the radiative fin may be tuned to emit spatially and temporally coherent thermal radiation as a super-Planckian blackbody (exceeds the blackbody limit of radiative heat transfer). The emitter's surface features may be tuned for narrow-band emissivity in the optical, near/mid/far infrared atmospheric windows.

As described, the thermal metasurface may be a set of geometries that are printed with lithography techniques on upper planar sides or emitter planes 120 and 220. For example, using lithography techniques, geometries may be cut into a layer of dielectric material, such as plastic, to expose a metallic material underneath. In the alternative, a set of geometries may be cut out of a metallic material and back filled with a dielectric material, such as plastic. The properties of a thermal metasurface are determined by the geometries of otherwise symmetric nano-pillars which are constructed from a doped substrate. The nano-pillars are distorted into two alternating ellipses oriented approximately 90° from another with major and minor diameters being perturbed by $\delta$ and the concentration of the dopant being perturbed by k as alternating arrays are aligned on the surface. These two parameters allow for tuning of the efficiency of the thermal radiation $Q_r$ and the "losses" associated with non-radiative recombination, $Q_l$, where the radiative Q factor is:

$$Q_r = \frac{\omega_0}{2\gamma_r}, \propto \frac{1}{\delta^2} \qquad \text{(Eqn. 1)}$$

and where the non-radiative Q factor is:

$$Q_l = \frac{\omega_0}{2\gamma_i}, \propto \frac{1}{k} \qquad \text{(Eqn. 2)}$$

Figure 5A:
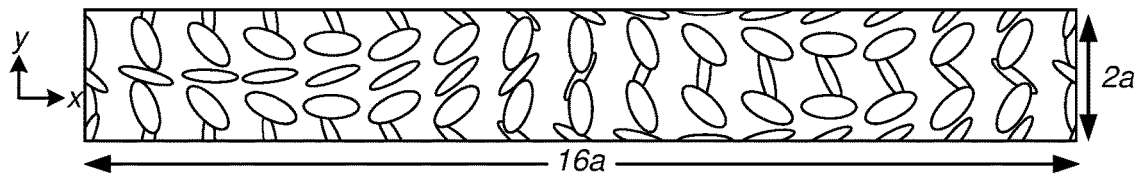
FIGS. 5A and 5B illustrate exemplary diagrams of a thermal metasurface configured for an upper planar side of an emitter plane of a concentrator rod.
Figure 5B:
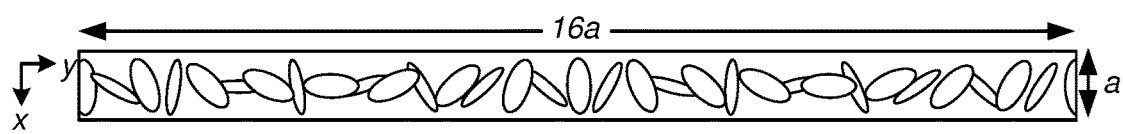

FIGS. 5A and 5B illustrate exemplary diagrams of a thermal metasurface configured for an upper planar side of an emitter plane of a concentrator rod. As illustrated, two exemplary alternating ellipses are shown in FIGS. 5A and 5B having alternating lines and perturbation of the angle at which the ellipses are oriented along the x-axis.

If the concentration of the dopant and the orientation of the angle is simultaneously perturbed, the thermal metasurface framework allows for arbitrary control of the optical properties of thermal radiation emitted by the surface. In the case of the parabolic fin, the temporal coherence is enhanced to sufficiently allow for parabolic bending of the bulk material to result in focusing. Spatial coherence in this case is controlled through the parabolic nature of the fin. Similarly for the emitter surface, the spatial coherence of the thermal radiation is enhanced to enable collimation of thermal radiation which has been tuned for its narrow-band IR emission in the three atmospheric windows of Earth. When the parabolic fin is a super-Planckian emitter (exceeds the blackbody limit of radiative heat transfer), the concentrator rod acts as an optical coupling and lens to facilitate the transfer of the radiation from the emitter into the optical fiber bundle. Optical routing is then used to allow the propagating thermal photons to be directed at particular points of the sky. If that light is highly temporally and spatially coherent, the radiation can be focused onto surfaces or energy recovery devices. When the radiation is emitted only in the narrow band atmospheric windows, and the radiation is focused onto the lower lens of the concentrator rod, the parabolic fin acts as a heat pump (observing the concentrator rod as a low temperature pathway to toward equilibrium with the background of space rather than the local environment) using the concentrator rod's apparent low-temperature as a heatsink to dump its radiative thermal energy into.

It is important that in the embodiments illustrated in FIGS. 2-3 and 4 upper planar sides or emitter planes 120 and 220 of concentrator rod 108 and 208 are sky-facing. In the FIG. 3 embodiment, upper planar side of concentrator rod 208 is exposed indirectly through an optically free-path via a series of mirrors and lenses. In the FIG. 4 embodiment, upper planar side of concentrator rod 208 is connected to fiber optic cable 222, which has the opposite endpoint exposed directly to the sky-facing environment. In both FIGS. 3 and 4, the parabolic fins may be stacked along a high-thermal conductivity plane, such as a vapor chamber or anisotropic material with the plane of highest thermal conductivity aligned perpendicular to the cold plate. Such an embodiment will be discussed below.

Figure 6:
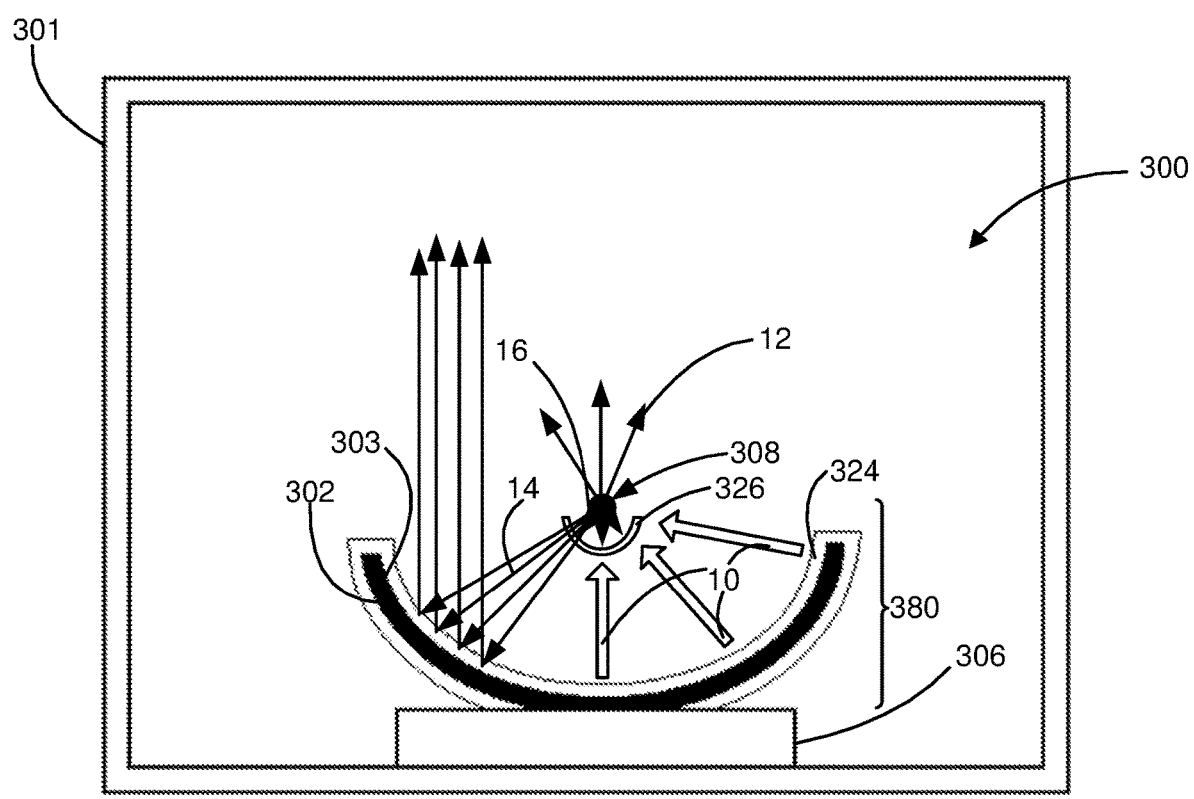
FIG. 6 illustrates a schematic diagram of a passive radiative heatsink device according to another embodiment.

FIG. 6 illustrates a schematic diagram of a passive radiative heatsink device 300 according to another embodiment. Radiative heatsink device 300 includes a radiator 380. As illustrated, the concentrator rod of FIGS. 2-3 and 4 of radiators 180 and 280 is replaced with a thin wire 308, limited in diameter by the accuracy by which the focal point of concave parabolic fin or emitter 302 can be reliably maintained. Device 300 also includes a one-way mirror 326 and a coating 324 on the surfaces of parabolic fin 302 including upper concave surface 303. Coherent infrared radiation 10 is emitted from parabolic fin 302 and is concentrated by one-way mirror 326 onto wire 308. A portion 14 of the concentrated radiation is emitted from wire 308 back to parabolic fin 302 and coating 324 directs the portion of concentrated radiation 14 back out of casing 301. Another portion 16 of the concentrated radiation is optically emitted from wire 308 and is reflected by one-way mirror 316 out of the casing. The remainder 12 of the concentrated radiation is emitted from wire 308 out of the casing. If wire 308 is placed inside a vacuum, maintained by a chamber constructed of materials which are transparent to the incident radiation, but reflective to the visible radiation, the concentrated radiation will heat wire 308 to efficiently emit blackbody radiation into the visible regime. This enables efficient up-shifting of the concentrated narrow-band infrared to visible wavelengths of light.

In the embodiment illustrated in FIG. 6, the spatial and temporal coherence of the thermal radiation from parabolic fin or emitter 302 is controlled via surface patterning or nano/micro particle doping 324 on surface 303. Temporal and spatial coherence of fin surface 303 makes it possible to direct and focus the emitted radiation to an arbitrary focal point or series of points along concentrator rod 308. In this case, the concentrator rod is replaced by a thin wire limited only by the achievable level of coherence of the fin and the accuracy of the parabolic focal point along the plane of the wire.

In each of the passive radiative heatsink embodiments in FIGS. 2-3, 4 and 6, concentrator rod 108 and 208 and wire 308 are thermally isolated from cold plate 106, 206 and 306, which is attached to a heat source. In the passive radiative heatsink embodiments, cold plate 106, 206 and 306 have common features including high-thermal conductivity, high heat capacity, high melting point and different maximum phonon frequency at the top of the cold plate relative to the bottom of the cold plate. The features of high-thermal conductivity, high heat capacity and high melting point may be achieved with metals such as copper and aluminum, with copper having a maximum thermal conductivity of 300 W/m-K. However, in order to maximize the difference in photon frequencies between the top and the bottom of cold plate 106, 206 and 306, and within the desired temperature range of 25-100 degrees C., exemplary materials and processes for cold plate include sintered-based ceramics, multi-material alloys and physical vapor deposition techniques to achieve the desired effects.

Figure 7:
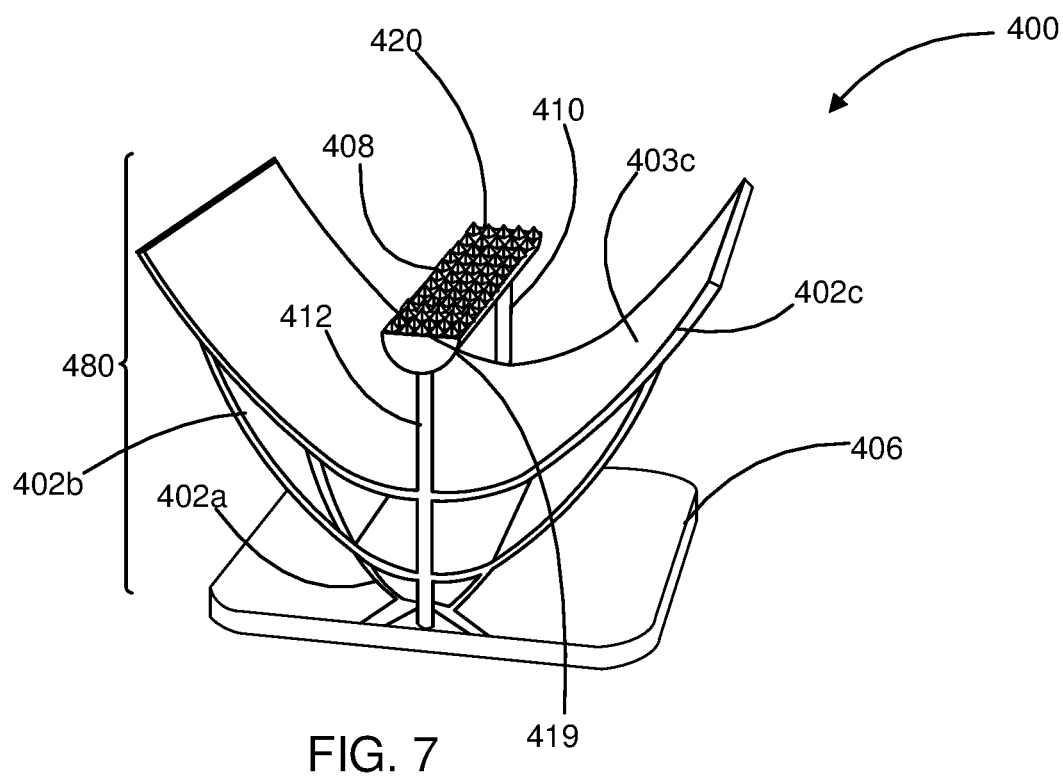
FIG. 7 illustrates a perspective view of a passive radiative heatsink device having interacting stacked fins according to an embodiment.

FIG. 7 illustrates a perspective view of a passive radiative heatsink device 400 having a radiator 480 with interactive stacked fins according to an embodiment. In this embodiment, radiator 480 includes a plurality of stacked interacting concave parabolic fins 402a, 402b and 402c. The interacting parabolic fins 402a, 402b and 402c are stacked with the focal plane of each fin concentrating coherent thermal radiation onto the fin directly above it. This design can utilize surface patterning such as split-ring resonators (SRRs) to achieve tuned absorption or frequency-doubling effects which depend on the placement of a particular fin relative to the fins above and below it. Because thermal radiation is concentrated on the fin above it, the SRR array defined on the fin should emit at a frequency that the neighboring fin above is tuned to absorb. Through frequency doubling, the radiation emitted by each subsequent SRR array more efficiently transmits the deposited thermal energy.

Device 400 further includes a cold plate 406 and a concentrator rod 408. The focal planes of each concave parabolic fin or emitter 402a, 402b and 402c are centered on cold plate 406 with first parabolic fin being coupled to a top surface of cold plate 406 such that the concave surfaces of parabolic fins or emitters 402a, 402b and 402c are facing upwards toward concentrator rod 408. Concentrator rod 408 is spaced apart from concave parabolic fin or emitter 402 and may be shaped like a halfpipe including having a convex-shaped lower surface 419 and an upper planar side 420. A bottom surface of cold plate 406 is configured to attach to a heat source In one embodiment, concentrator rod 408 is mounted on a pair of support bars 410 and 412 that protrude from opposing ends of the central focal plane of concave parabolic fins 402a, 402b and 402c. In this way, concentrator rod 408 is spaced apart from upper surface 403c of upper parabolic fin or emitter 402c and oriented widthwise along the central focal plane of the parabolic fin 402c. However, it should be realized that other structural features other than a pair of support bars 410 and 412 may be used for spacing concentrator rod 408 away from upper concave surface 403c of parabolic fin or emitter 402 are possible.

Figure 8:
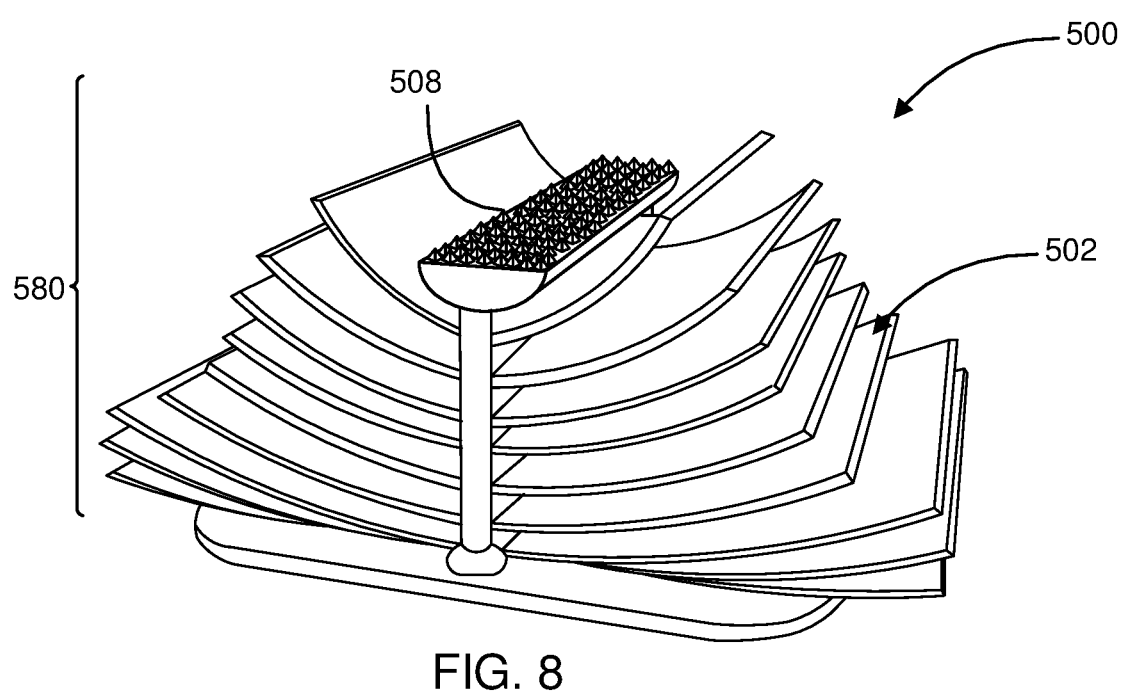
FIG. 8 illustrates a perspective view of a passive radiative heatsink device having non-interacting stacked fins according to an embodiment.

FIG. 8 illustrates a perspective view of a passive radiative heatsink device 500 having a radiator 580 with non-interacting stacked fins according to an embodiment. In this embodiment, radiator 580 includes a plurality of stacked non-interacting concave parabolic fins 502. In the FIG. 8 embodiment, the focal point of each parabolic fin 502 controls the spatial coherence of the light, and the temporal coherence is controlled via surface patterning or nano/micro particle doping (e.g. a thermal metasurface) to allow for coherent focusing of the emitted radiation to an arbitrary point or series of points along concentrator rod 508. Given the doping and materials of the parabolic fins 502, the surface of each fin is described by an array of split-ring resonators (SRRs) which absorb and emit at the correct wavelengths, the bottom most fin can emit radiation which passes freely through the fins above it, such that the focal point of each fin can then be chosen to be the same points along the concentrator rod 508. However, in other embodiments of a passive radiative heatsink, the role of the concentrator may change along with the parabolic fins.

Figure 9:
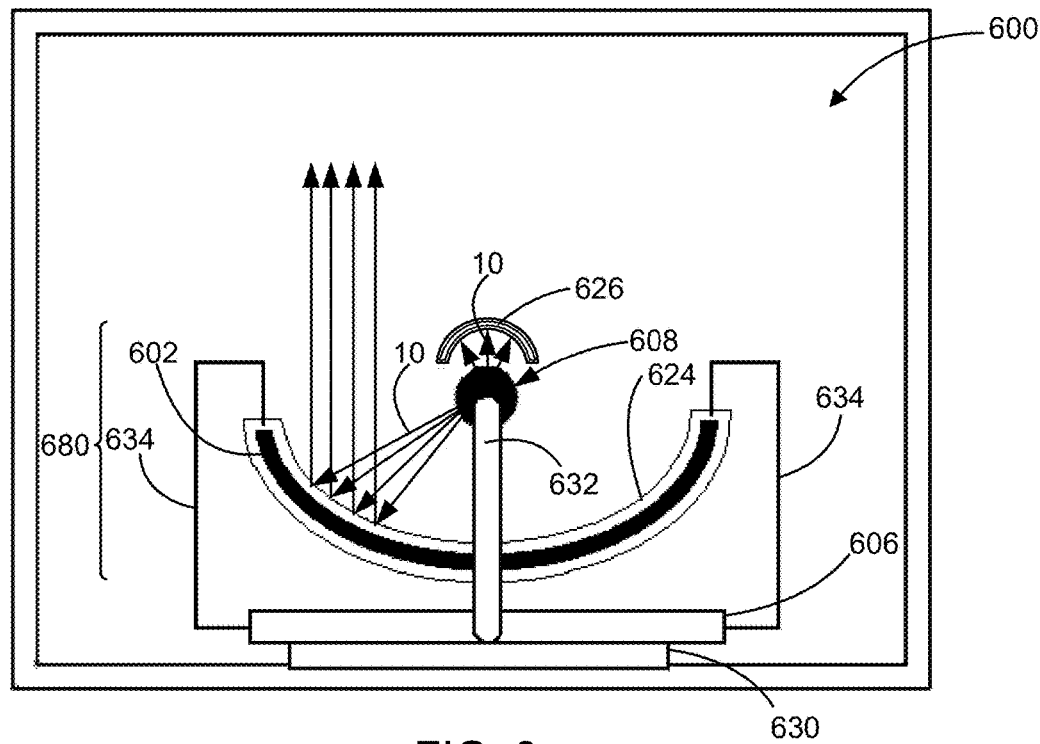
FIG. 9 illustrates a schematic diagram of a passive radiative heatsink device according to an embodiment.

FIG. 9 illustrates a perspective view of a passive radiative heatsink device 600 having a radiator 680 according to an embodiment. Instead of concentrating radiation along a focal plane of parabolic fin 602 of radiator 680, rod 608 of radiator 680 serves as an emitter. In particular, emitter rod 602 is thermally coupled to heat source 630 at high thermal conductivity points of contact, such as by a heat pipe(s) 632 or materials with anisotropic heat transfer properties, while parabolic fin 602 is thermally coupled to cold plate 606 via wire(s) 634.

Emitter rod 608 requires no surface patterning or etching to achieve coherence. Parabolic fin(s) 602 are coated in infrared-reflective materials 624 and used to collimate the thermal radiation 10 emitted from emitter rod 608 outside of the casing 601. The primary source of radiation in the FIG. 9 embodiment is never concentrated. The maximum temperature will be the maximum temperature of heat source 630 attached to cold plate 606. All of the heat pumped into cold plate 606 will be delivered via heat pipe(s) 632 to the emitter rod 602. By ensuring the lower half of emitter rod 608 has near-unity emissivity, for example, acting as a perfect blackbody radiator in the spectral range over which the parabolic fin(s) 602 have maximal reflectivity, infrared radiation 10 emitted by emitter rod 608 may be directed via the orientation of fin(s) 602 about the focal point, which is centered along emitter rod 608.

Figure 10:
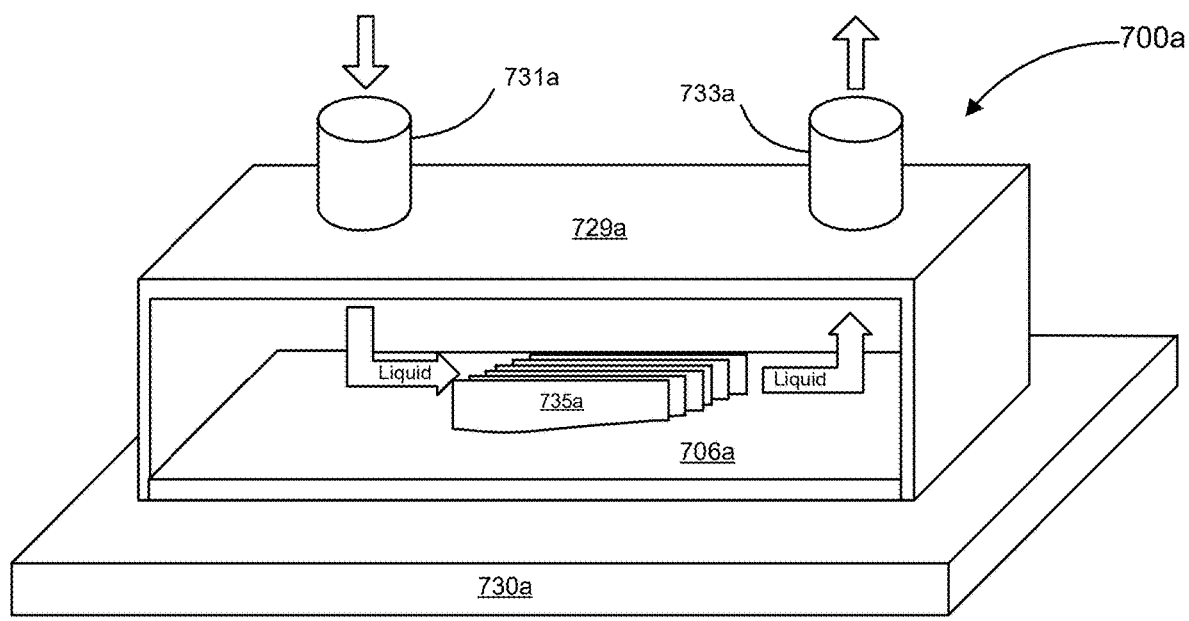
FIG. 10 illustrates a schematic diagram of an exemplary liquid cooling system according to the prior art.

FIG. 10 illustrates a schematic diagram of a standard exemplary liquid cooling system 700a according to the prior art. A cold plate 706a for any liquid cooling system serves to provide a high rate of thermal energy transfer to the working fluid of the system, usually liquid water (or liquid water/glycol mixtures), as it flows through a water block 729a from a cold reservoir at a liquid inlet 731a to a liquid outlet 733a. Cold plate 706a provides a fin-based mechanism 735a to guide the flow through water block 729a, increasing its flow rate across a high-surface area to maximize conductive energy transfer to the fluid from the heat source 730a on the opposite side of cold plate 706a.

Figure 11:
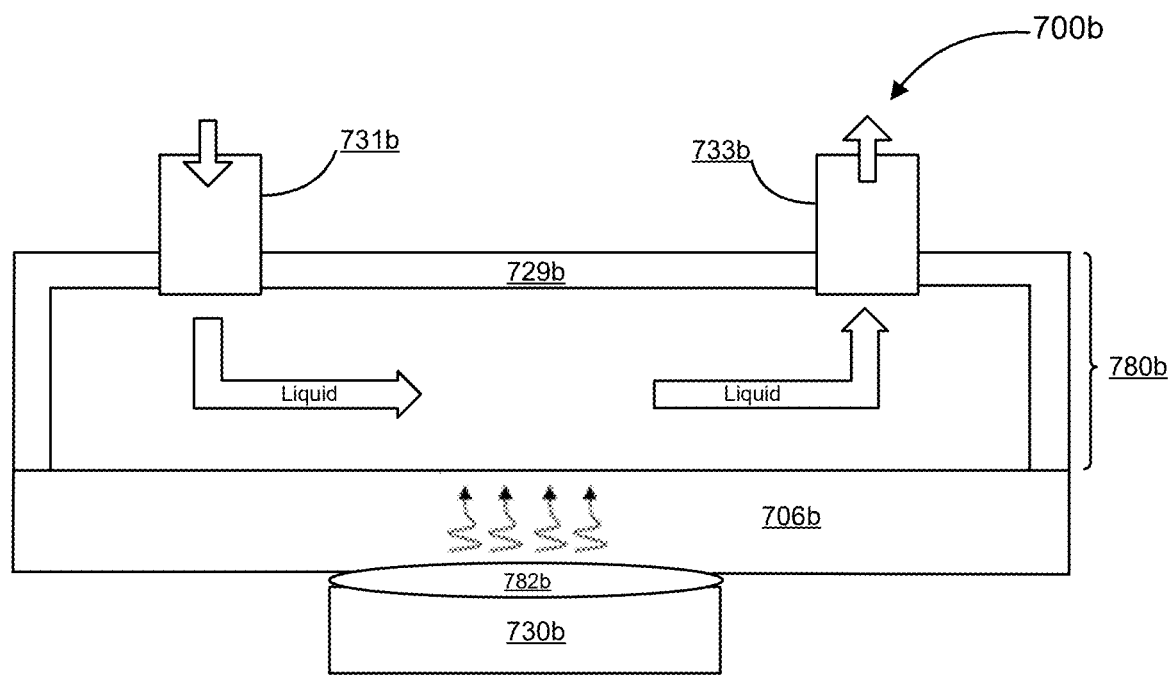
FIG. 11 illustrates a perspective view of a passive radiative heatsink device having a liquid cooling system according to an embodiment.

FIG. 11 illustrates a schematic diagram of a passive radiative heatsink 700b having a water block radiator 780b according to an embodiment. Passive radiative heatsink 700b is a near-field integrated cold plate that enhances the standard water block system to take advantage of both near-field thermal radiation or emission effects as well as far-field thermal radiation or emission effects. While FIG. 11 illustrates the radiator as being a water block radiator 780b, it should be realized that radiator 780b may be any type of suitable radiator including radiators 180, 280, 380, 480, 580 or 680 previously discussed, and may be attached to the top of the cold plate such that is maximally exposed to the working fluid of the water block.

Cold plate 706b comprises a ceramic-based material and is coupled to heat source 730b by a thermal interface material or thermal compound 782b. The material of cold plate 706b and thermal interface material 782b enables a new vector of energy transfer via radiation into a working fluid, thereby enabling faster transfer of heat away from heat source 730b than is achievable with standard materials and configurations. The exemplary working fluid in FIG. 11 is water that passes through the water block.

Thermal energy is transferred from heat source 730b to thermal compound 782b, the thermal compound 782b having been tuned by material choice, particle size, particle structure shape and orientation to be a super-Planckian emitter in the wavelength regions maximally absorbed by selection of the cold plate materials (ceramic), such that the thermal energy is split into radiative and kinetic components by the thermal compound and absorbed by the cold plate faster than is possible using kinetic transfer of the thermal energy alone. In particular, thermal compound 782b is configured to convert a portion of first phononic thermal energy (lattice phonons, kinetic collision energy or the kinetic component) from the heat source into a first photonic near-field thermal radiation and a first photonic far-field thermal radiation (the radiative component) and is configured to maximally transfer the first photonic near-field thermal radiation and the first photonic far-field thermal radiation at the same time as the remaining first phononic thermal energy into cold plate 706b. Thermal compound 782b causes cold plate 706b to heat faster (e.g. more energy is transferred into the cold plate lattice in less time)

Cold plate 706b includes a bulk material that has a higher cooling power relative to the limit where the kinetic transfer of heat across the interface is maximized. In other words, the bulk material of cold plate 706b is configured to combine the first photonic near-field thermal radiation, the first photonic far-field thermal radiation and the remaining first phononic thermal energy into a second phononic thermal energy and provide the second phononic thermal energy to radiator 780b. Heat is transferred to the working fluid of the system. In FIG. 11, the exemplary working fluid is liquid water (or liquid water/glycol mixtures), and may or may not be enhanced to absorb the primary frequency bands over which the cold plate's ceramic or radiator is tuned to emit or transmit relative to the thermal compound. Water flows through water block 729b from a cold reservoir at a liquid inlet 731b to a liquid outlet 733b and across radiator 780b attached to the upper fluid-facing side of the cold plate. The materials or material structure of the upper fluid-facing part of the cold plate (e.g. the radiator) may be further modified dynamically to enhance the transfer of both kinetic and radiative thermal energy into the working fluid depending on the properties of the fluid (e.g., flow rate, temperature, chemistry). In this paradigm, the working fluid is heated in two ways-through the kinetic (phonon-mediated) transfer of thermal energy from the heating of the cold plate, and through the radiative (photon-mediated) transfer of thermal energy. The radiative thermal energy is emitted by the heating of the cold plate itself, or it is emitted by the thermal compound and/or heat source below and transmitted through the cold plate into the working fluid.

Furthermore, this paradigm enables two new mechanisms for radiative transfer of energy to occur. First, the heated cold plate may be optimized to maximally emit and transfer thermal radiation in the bands of maximal absorption for the working fluid, while the lower part of the cold plate is tuned to maximally absorb the radiation emitted by the thermal interface material. This effect could be further enhanced through optimization of the radiator topology of the fluid-facing side to increase surface contact area of the working fluid relative to a desired flow rate. Second, the cold plate can be engineered to be transparent in various bands of the electromagnetic spectrum, such that the radiation emitted by the thermal compound and/or heat source is either transmitted directly into the working fluid, or is deposited into the bulk material of the cold block. Some embodiments also integrate at least one thermoelectric cooler or other solid-state cooling element into the lower portion of the cold plate such that the cold side of the solid-state cooling element is facing the heat source, and the hot side of the solid-state cooling element is facing the bottom of the radiator or cold plate surface in contact with the working fluid.

Figure 12:
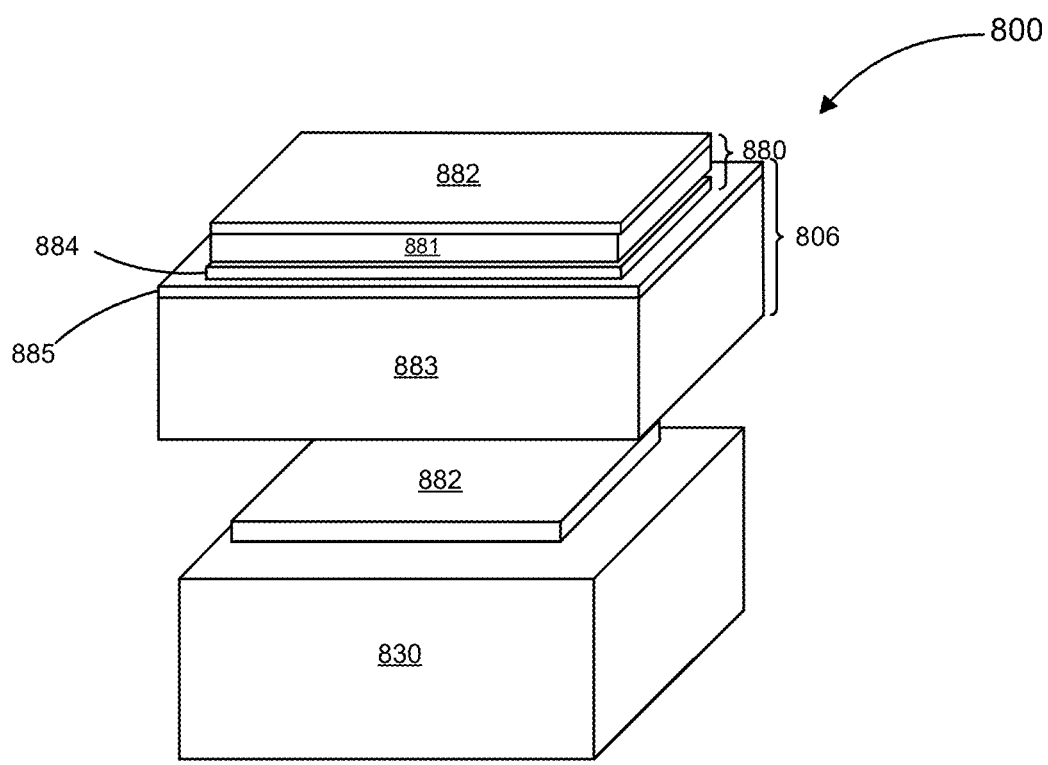
FIG. 12 illustrates an exploded diagrammatic perspective view of a passive radiative heatsink device having a photonic crystal radiator according to an embodiment.

FIG. 12 illustrates a schematic diagram of another embodiment of a passive radiative heatsink 800 coupled to a heat source 830. In particular, FIG. 12 illustrates a super-Planckian passive radiative heatsink 800 that includes a radiator 880, a cold plate 806 and a thermal interface material or thermal compound 882. Radiator 880 includes a distributed Bragg reflector (DBR) 882, a woodpile photonic crystal 881, and a black body pump layer 884, or powered coherent light source 884, such as a diode laser, while cold plate 806 includes a reflector 885 and a bulk material 883. It should be realized that thermal compound 882 and cold plate 806 operate like thermal compound 782$b$ and cold plate 780$b$ discussed above and that radiator 880 is an exemplary radiator and may be any of the radiators 180, 280, 380, 480, 580, 680 and 780$b$ discussed previously above.

In the near-field, super-Planckian thermal radiation is achieved through thermal interface material 882. Thermal interface material 882 thermally couples heat source 830 to bulk material 883 of cold plate 806 and comprises a thermal compound material configured to control and enhance thermally excited effervescent surface waves at heat source 830. Thermal interface material 882 includes a dielectric and electrically insulating thin film substrate capable of super-absorbance and super-Planckian radiation. Thermal interface material 882 is configured such that thermal energy in the surface waves at heat source 830 is driven to propagate into the thermal compound or interface material via near-field interactions along the nano/micro-metallic particles loaded within the dielectric substrate of the thermal interface material. Near-field thermal radiation is driven to interact strongly with the material along the cold plate surface to maximize both the kinetic transfer of heat into cold plate 806 from heat source 830 (via traditional surface-defect minimization and gap filling) and simultaneously maximize the surface-wave mediated near-field thermal radiation transfer into cold plate 806.

In the far-field, super-Planckian thermal radiation may be achieved through a mix of spatial and temporal coherence enhancement and optical band gap tuning via the three-dimensional metallic photonic crystal lattice structure as described below.

Figure 13:
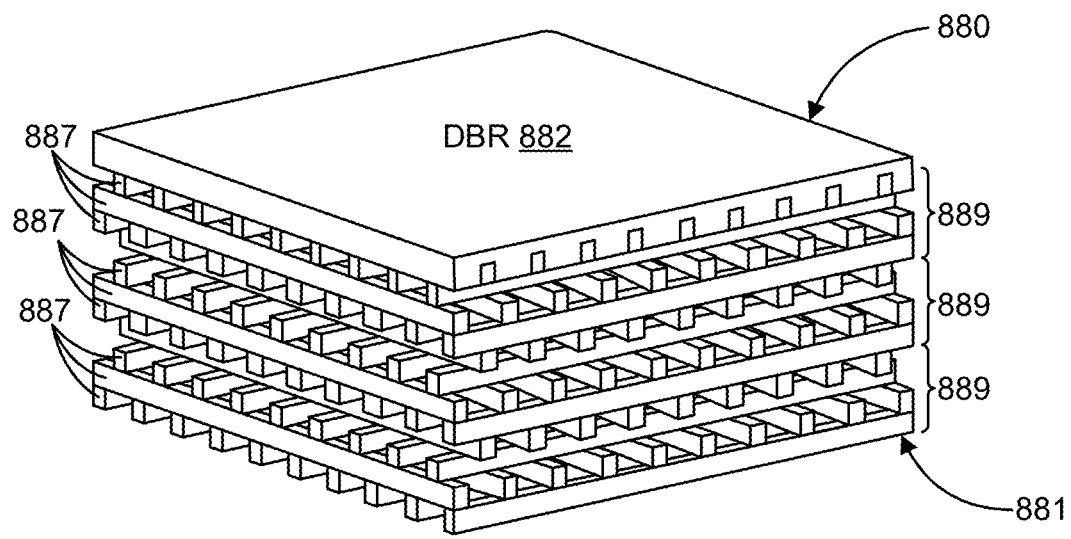
FIG. 13 illustrates a diagrammatic perspective view of woodpile photonic crystal radiator according to an embodiment.
Figure 14:
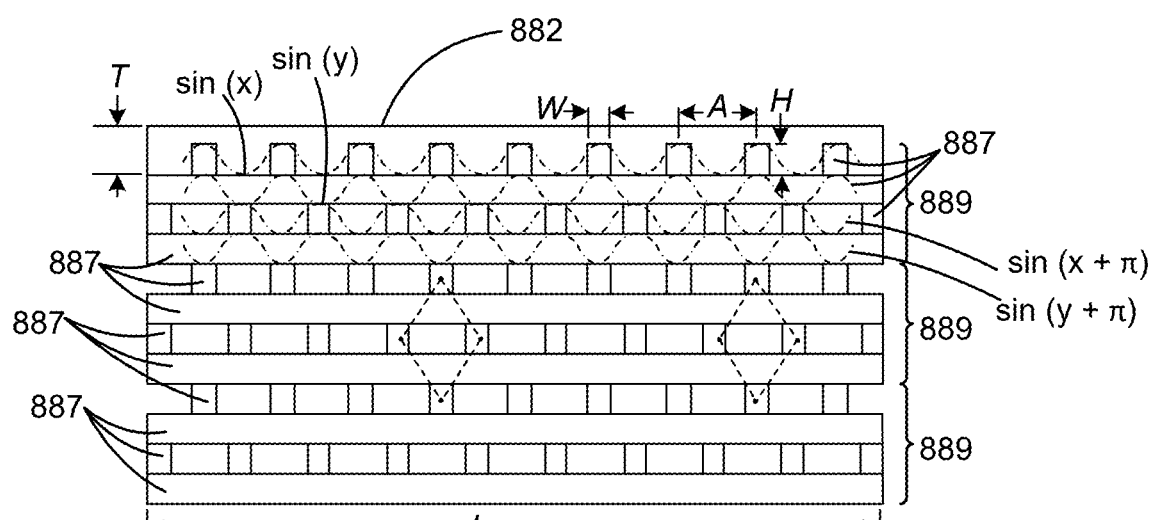
FIG. 14 illustrates a side view of FIG. 13.

FIG. 13 illustrates a perspective view of radiator 880 and FIG. 14 illustrates a side view of FIG. 13, including radiator 880 having a woodpile photonic crystal 881 and DBR 882. Above the top-most unit cell layer L=N, some embodiments include DBR 882 is a top-most layer or coating deposited or mounted on top of photonic crystal 881 to act as a narrow-passband filter, which reflects all wavelengths except at a narrow-passband near the optical band edge or effective plasma cutoff frequency produced by a tuned diamond lattice symmetrical structure of photonic crystal 881. For example, DBR 882 may be constructed of thin-film deposited layers of alternating materials, such as silicon and silicon oxide configured such that specific stopbands exist at the band-edges of each of the photonic crystal layers below, allowing only the distinct narrow-band super-Planckian thermal radiation emitted by each layer L to be transmitted to the environment, and maximally reflecting all other frequency bands. In addition and in another embodiment, the top-most layer of the photonic crystal may be modified to further enhance the directionality and constrain the angle of the emitted thermal photons to be spatially and temporally coherent.

Woodpile photonic crystal 881 of radiator 880 comprises an arbitrary number of layers of individually and alternating stacked "planks" or "beams" 887 of refractory metallic material that form a "woodpile" configuration. Four layers of n stacked "planks" or "beams" 887 comprise a unit cell 889 and each unit cell 889 defines the photonic crystal 881 as having a diamond lattice symmetry (illustrated by the broken lines in FIG. 14). "Beam" or "beam" structures 887 each have a height H (in the z-dimension), width W (in the x-dimension for top layer in diagram below), and an arbitrary length L ($L_y$ in the y-dimension for top layer, $L_x$ in the x-dimension for second to top layer), and spaced distance A from the next beam. As the 4 layers of beams are stacked, each layer's beams are rotated by $\phi=90°$ relative to the subsequent layer. If the peaks of function sin (x+θ) represent the center position of each plank in the top layer, and the peaks of the function sin (y+θ) then θ=0 for the top two layers. The last two layers then have the phase of their plank's positions shifted uniformly by setting θ=π relative to the first two layers, respectively. The parameters defining the 4 layers of beams (H, W, $L_x$, $L_y$ and A) of a lattice unit cell layer L are constant, but can vary as multiple unit cell layers are stacked up to N times.

The final layer of the top-most PC unit cell layer (L=N) is responsible for maximizing the spatial coherence of the emitted thermal radiation. The parameters for the lengths of the beams, L, and the number of planks, n are split into two components. For L, the components are $L_x$ and $L_y$, respectively. For the number of planks in either dimension, we have $n_x$ and $n_y$.

Each beam may have an arbitrary length (L) so long as the lattice spacing or beam to beam spacing (A) and beam height (H) and beam width (W) ratios are maintained such that the photonic crystal retains its super-Planckian passive thermal radiation properties (i.e., properties of violating the black-body radiation law in spectral intensity, coherence, angle and directionality). Maintaining spacing A, height H and width W ratios means that spacing A, height H and width W are tuned, scaled, spaced and oriented relative to each other in such a manner so as to produce the required narrow-band emission for passive radiative cooling and to emit more blackbody radiative power per unit area (P) than is predicted by Planck's Radiation Law. For example, height H of each beam 887 may be one-half (½) of the spacing A from beam-to-beam and width W may be one-third (⅓) of the spacing A from beam to beam, which means width W of each beam 887 is less than height H of each beam 887 and the spacing A from beam-to-beam is greater than width W and greater than height H. Meanwhile, the length L of each beam 887 may be any given dimension as is required for the application.

The refractory material defining the beams of woodpile photonic crystal 881 has a surface roughness on the order of tens of nanometers, which is sufficient to support excited surface plasmon resonances. Super-Planckian passive radiative heatsink 800 further enhances emission such that it emits, or transmits along specific narrow bands defining the atmospheric windows of Earth at a 4-5 μm wavelength spectral range, 8-13 μm wavelength spectral range, and 16-26 μm wavelength spectral range, and such that the bulk device acts as a radiative cooler exhibiting itself, or transmitting super-Planckian near-field and far-field thermal radiation in the bands associated with atmospheric windows, and simultaneously highly reflective in all others. For example, the refractory material of each "beam" may comprise tungsten. While pure tungsten has its own crystal structure, the "beam" of photon crystals are manufactured in such as way so as to create a new crystal structure of tungsten.

Planck's law of radiation, which is the spectral radiance of a body (B) as a function of wavelength (λ) and temperature (T) and is written in equation 3 as:

$$B_\lambda(\lambda, T) = \frac{2hc^2}{\lambda^5} \frac{1}{e^{\frac{hc}{\lambda k_B T}} - 1} \quad \text{(Eqn. 3)}$$

where h is Planck's constant, c is the speed of light in the medium, and $k_B$ is Boltzmann's constant. The total power radiated (P) per unit area at the surface of a blackbody may be found by integrating Planck's radiation formula. Below is the integrating of Planck's radiation formula as a function of frequency of light (v) rather than as a function of wavelength (λ) and is written in equation 4 as:

$$P = \int_0^\infty dv \int_0^{\frac{\pi}{2}} d\theta \int_0^{2\pi} d\phi B_v(T)\cos(\theta)\sin(\theta) = \sigma T^4 \quad \text{(Eqn. 4)}$$

The above integral is typically used to define the Stefan-Boltzmann Law, which describes the power limit (P) for a perfect blackbody radiator at temperature T, emissivity ε, and the Stefan-Boltzmann constant σ, which is written in equation 5 as follows:

$$P = A\epsilon\sigma T^4 \quad \text{(Eqn. 5)}$$

Typically the emissivity of an object is a property of its surface describing its blackbody radiation characteristics over a particular wavelength regime. For an ideal blackbody, the power emitted by the object at a given temperature is completely described by B(λ, T) for each wavelength. It is only by integrating over all frequencies (or wavelengths), all angles, and over the entire surface do we arrive at the total power radiated. Therefore, as an object approaches the ideal blackbody limit, the emissivity approaches 1.

This normalization has historically served as justification to ignore the radiation component of heat transfer when designing cooling solutions since the conception of statistical mechanics. At the modest package temperatures (less than 100° C.) found within modern HPC processors (now operating at ~300 W) having a surface of about 25 cm², even assuming the emissivity of a perfect blackbody, the Stefan-Boltzmann law implies the power emitted in the form of radiation is less than 2 Watts.

However, the Stefan-Boltzmann law does not apply for wavelength and sub-wavelength scale objects, or to objects whose surface includes nanostructures. By maximizing the number of thermal photons released from the surface of radiator 880 per unit time, along with the temporal and spatial coherence, super-Planckian passive radiative heatsink 800 may pump hundreds of watts of power into the far-field infrared band from the same surface area and simultaneously enable novel energy recovery schemas due to the intrinsic focusability of the coherent radiation. Indeed, Super-Planckian thermal emission can occur at any wavelength if the object radiates more power than is predicted by B(λ, T). In practice, this can be achieved by scaling one or more of the radiating object's dimensions below the thermal wavelength of the emitted light, by engineering materials to expose surface features at or below thermal wavelengths on the surface of a larger radiator, or engineering features which enhance the temporal and spatial coherence of the thermal photons.

As described above, Planck's Radiation Law, B(λ, T), describes the spectral emissive power per unit area, per unit solid angle, per unit frequency. In addition to the assumption that the emitter has uniform properties in all spatial dimensions, it includes the assumption that thermal radiation follows the Lambertian Emission Law, which is another way of stating the assumption that blackbody radiation is spatially and temporally incoherent.

Super-Planckian near-field and far-field thermal radiation can therefore occur as a consequence of spatially modulating the directionality of the thermal photons emitted (e.g., breaking the Lambertian assumption), or by increasing the rate of electronic processes that lead to excitation of localized surface plasmons. In the latter case, the constraints on the localization are imposed by the diamond symmetry of the woodpile topology of photonic crystal 881 and the micro- and nano-structures defining its surfaces. Photonic crystal 881 has seven free parameters that are "adjustable" and include: spacing A of beams 887, width W of beams 887, height H of beams 887, a thickness T of DBR 882, a power supplied to heat source 830, material of photonic crystal 881 and the material (e.g., air, polymer) located between gaps in photonic crystal 881.

Underneath photonic crystal 881 (L=0) is an ideal blackbody pump 884 of radiator 880 (i.e., a blackbody pump material), such as a layer of dense aligned carbon nanotubes (CNTs) or nano-structured tungsten, to act as an ideal blackbody emitter, with an ideal thermal conductivity. Blackbody pump 884 is configured to maximally facilitate both the phonon-mediated and photon-mediated transfer of heat into photonic crystal 881 and thermally connects photonic crystal 881 to cold plate 806. The blackbody pump might also be replaced by a coherent light source, such as an optical signal generator which actively pumps coherent laser light or otherwise integrates a frequency pumping mechanism, into the base of the super-Planckian photonic crystal such that the temporal coherence of the emitted super-Planckian thermal radiation is enhanced.

The simplest embodiment requires only a single lattice unit cell layer (i.e. L=N=1) emitting super-Planckian thermal radiation in a single narrowband region of any of the atmospheric windows. In other embodiments, multiple unit cell layers L=1, 2, 3 . . . . N can be stacked, each having distinct lattice parameters (H, W, $L_x$, $L_y$, and A) relative to the subsequent unit cell layer below it (i.e. L−1). Such embodiments enable multiband radiative cooling to occur within each of the distinct atmospheric window regions, where the top-most layer L=N is configured to maximally transmit the super-Planckian thermal radiation emitted from the unit cell layer below it (L−1). Thus, radiator 880 of super-Planckian passive radiative heatsink 800 emits super-Planckian narrow-band thermal radiation in one or more of the atmospheric windows of Earth. Radiator 880 transports heat from cold plate 806 into photonic crystal 881, and pumps the heat into outer space through the one or more frequency bands defining the atmospheric windows of earth.

Cold plate 806 serves to thermally connect heat source 830 to radiator 880, and provide a thermal reservoir for the heat deposited from heat source 830. Cold plate 806 includes a reflector 885 deposited on a bulk material 883. Reflector 885 is a thin metallic or polished ceramic layer of material which acts as an ideal reflector across all relevant wavelength bands of atmospheric infrared light, solar radiation and the blackbody and narrow-band radiation emitted by the radiator 880. Reflector 885 operates such that any thermal radiation from the environment or radiator 880 is reflected rather than absorbed by bulk material 883 of cold plate 806.

Bulk material 883 is capable of maximum absorption across all bands of relevant wavelengths for the heat source 830 and thermal compound below, and as described above in earlier embodiments, has a high thermal conductivity, a high heat capacity and high electrical resistivity. Example materials include silicon carbide (SiC), engineered ceramic, and other materials with similar properties.

Thermal interface material 882 comprises materials that have a high thermal emissivity relative to bulk material 883 and to a temperature of heat source 830. The thermal interface material or thermal compound is composed of high-thermal conductivity, high-emissivity particles or structures, with high spatial anisotropy in one dimension, meaning their width and diameter are much larger (e.g. microns) than their height, for example (e.g., on the order of nanometers). The particles or structures may or may not be electrically conductive, metallic or ceramic in nature. Some portion of the thermal compound may be composed of specific-sized carbon nanotubes to match the absorption characteristics of the bulk material of the cold plate, and/or the working fluid and its component parts. It should be understood that exemplary working fluids may include water-based liquid when the radiator is a water block, but may also be gaseous particles making up the background of outer space. The component particles and structures comprising the thermal compound are enhanced such that they emit super-Planckian thermal radiation into both near and far regimes of the electromagnetic fields surrounding the embedded particles and structures, through and around the substrate (e.g., a polymer, epoxy or dielectric fluid) into which they are loaded, and deposit the thermal radiation they emit maximally into, or through the materials of the cold plate, or maximally into the working fluid of the water block in the case of a direct liquid cooling based system.

The guiding principle in producing an ideal cold plate to attach to the radiative heatsink is to maximize the penetration depth (or skin depth) of the radiation emitted by the thermal interface material relative to the cold plate bulk material. The skin depth is defined as the distance by which the amplitude of an incident electromagnetic wave has been reduced by 1/e for any given material, and it can be approximated by:

$$\delta = \frac{1}{\omega}\left(\frac{\mu\epsilon}{2}\left[\left(1 + \frac{\sigma^2}{\epsilon^2\omega^2}\right)^{\frac{1}{2}} - 1\right]\right)^{1/2} \quad \text{(Eqn. 6)}$$

where $\omega$ is the frequency of the radiation being attenuated by the material, $\sigma$ is the electrical conductivity, $\epsilon$ is the absolute magnetic permeability of the material and $\mu$ is the absolute electric permittivity of the material Super-Planckian passive radiative heatsink 800 achieves super-Planckian thermal radiation in both the near and far infrared fields and incorporates super-Planckian thermal radiation at both conceptual energy input and output channels of device 800, where broadband non-equilibrium heat pumping into bulk material 883 occurs at the input, and both broadband and narrowband non-equilibrium heat pumping into the electromagnetic field occurs at the output, such that the temperature of bulk material 883 is driven below the temperature of the local environment and atmosphere. The equilibrium state of bulk material 883 reaches the average temperature of the cosmic background radiation of the local universe.

In still other embodiments, a radiative heatsink may be an actively cooled radiative heatsink that integrates several features of a passive radiative heatsink and adds additional elements that require dynamic control of input power based on sensor feedback mechanisms. The sensor feedback is derived from arrays of temperature sensors integrated into the surface of the cold plate, and/or sensors which interact with infrared (1 um to 30 um) radiation, terahertz (30 μm to 3 mm) radiation, microwave (3 mm to 1 m) or radio (>1 m) radiation, such that a spatially and temporally aware machine learning model can perceive arbitrarily high-resolution spatial information about the temperature distribution at the surface of the heat source, and arbitrarily high-resolution spatial and temporal dynamics occurring inside the heat source. If the heat source is a processor or CMOS-based device, the dynamics are occurring in the range of clock speeds used to drive the logical operations on the chip. The sensors in these cases are arrays of the metallic loops embedded on a dielectric substrate layer within the cold plate bulk material, or embedded directly on the surface of the high-thermal conductivity, insulating substrate of the cold plate surface, and these loops are sized such that they are tuned to the frequency range of interest (e.g. the 1-10 GHz range for HPC processors). If these frequency logging sensors are distributed as an array on the cold plate surface, they serve as spatial markers for the location of the emerging radiation dynamics.

A machine learning model sufficiently trained is then used to perceive both the spatial and temporal dynamics of the radiation emerging from the computer chip, and decode these signals into raw instructions, or application-level performance information. This model can be further employed or expanded to map the information directly to actionable control points for fine-grain optimization of, for example, a solid-state cooling system, the bias-voltage applied to elements of an ELC solid-state emitter, or the actuators tuning the gap height in various embodiments of the active cold plate and active radiative heatsink devices. Both active and passive embodiments of the radiative heatsink device can utilize a combination of optical, thermal, infrared, THz, GHz, and MHz frequency sensors described above to perceive the dynamics of the microprocessor and be optimized to control various properties of the heatsink (e.g. the near-field thermal radiative transfer from the heat source, the frequency and polarization of the far-field thermal emission from the radiator, the bias-voltage applied across ELC elements) in a real-time and responsive manner. Sensors which detect the local atmospheric conditions (e.g. humidity) could also be used by the machine learning model to dynamically adjust the frequency of the emitting ELC elements or radiator such that the wavelengths emitted are tuned to not interact with, or conversely, strongly interact with various component chemicals defining the local atmosphere (e.g. water vapor). Regardless of the specific sensor feedback mechanism, these additional elements act in a symbiotic way to pump heat away from a heat source into the electromagnetic spectrum with higher effusivity than is possible using passive bulk materials or alloys alone.

Figure 15:
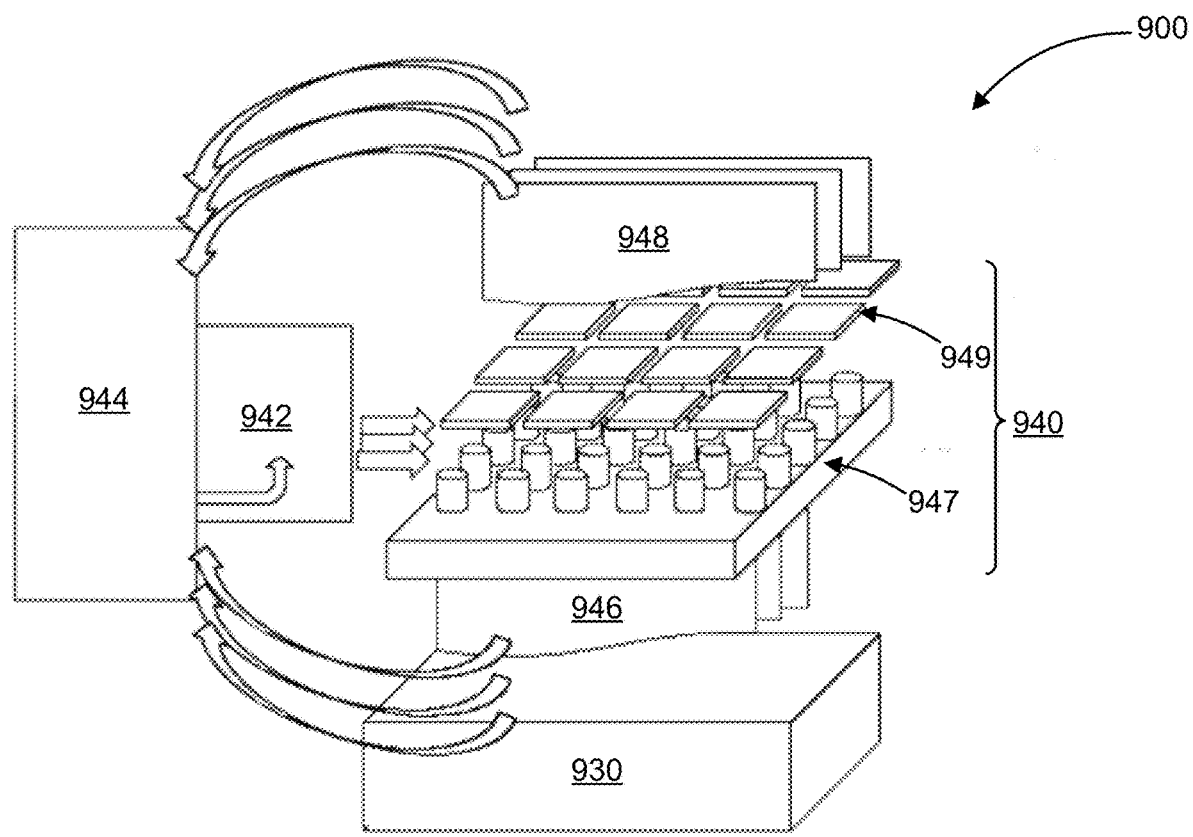
FIG. 15 illustrates a schematic diagram of an active radiative heatsink device according to an embodiment.

FIG. 15 illustrates a schematic diagram of an active radiative heatsink device 900 according to an embodiment.

In particular, active radiative heatsink device 900 includes a gap-tuned active cold plate 940, a gap actuator controller 942 and a near-field radiative heat transfer (NF-RHT) optimizer 944. Gap actuator controller 942 and NF-RHT optimizer 944 are configured to actively cool a heat source 930 by actively-controlling gap spacing as a function of temperature or thermal expansion of the materials. Gap actuator controller 942 changes distance (gap-tuning) between two materials, separated by less than 100 nm to achieve near-field radiative heat transfer above the blackbody limit, improving the effective thermal conductivity and heat flux in a real-time responsive and controllable manner. Alternating layers of bulk cold plate material, gap-filling dielectrics, and gap-tuning actuators may be stacked to further enhance the near-field radiative transfer in some embodiments.

As heat transfers through a bulk material, the response in the material is to expand as the temperature of the lattice increases. The rate that a material expands is a function of pressure, volume and temperature. Given a fixed pressure, rate of expansion ($\alpha$) is calculated in equation 6 as follows:

$$\alpha = \alpha_V = \frac{1}{V}\left(\frac{\partial V}{\partial T}\right)_p \quad \text{(Eqn. 7)}$$

Assuming linear expansion, expansion a is used to estimate the strain in equation 7 as:

$$e_{thermal} = \alpha_L \Delta T \quad \text{(Eqn. 8)}$$

An ideal radiative heatsink exploits all available mechanisms of energy transfer from a heat source to a cold reservoir and move the heat away from the devices as quickly as possible. In a solid state device, this means conductive, convective, far-field and near-field radiative heat transfer, is utilized, and the thermal expansion of the bulk materials is compensated for by the gap-tuning optimizer such that the near-field radiative transfer relative to the thermal interface material or heat source is maximized.

The thermal conductivity of a bulk material is generally the limiting factor in how quickly heat is transferred from a hotspot on a device, such as a computer processing unit (CPU) or a graphics processing unit (GPU), to the environment. In a radiative heatsink, the cold reservoir is provided by outer space, but requires that all heat in the bulk material is converted to far-field infrared radiation with wavelengths falling within all of the infrared and optical atmospheric windows of the earth.

One of the few means by which a bulk material's thermal conductivity may be enhanced is to focus on improving the effective thermal conductivity of the bulk material by adding small sub-wavelength vacuum gap spacing between layers. Although this technique does not change the rate of conduction in the solid parts of the material, the effective rate that thermal energy moves through the layers is greatly enhanced by near-field radiative heat transfer. For example, if the gap spacing between layers is maintained at approximately 100 nm with a temperature delta between two layers being approximately 50 degrees K, then the device may operate with a radiative heat flux exceeding 10,0000 W/m² from the hot side of the device to the cold side.

Gap-tuned active cold-plate 940 includes a first sensor array 946 that is coupled to heat source 930 on one side and coupled to a micro-pillar actuator array 947 on an opposing side. First sensor array 946 measures temperatures at different locations on heat source 930 and feeds that information to optimizer 944. Gap-tuned active cold-plate 940 also includes an opposing second sensor array 948 coupled to micro-plate array 949. Second sensor array 948 measures temperatures at different locations on gap-tuned active cold-plate 940 and feeds that information to NF-RHT optimizer 944. A grouping of four pillar elements of micro-pillar actuator array 947 are coupled to a single plate element of micro-plate array 949. Each of the four pillar elements of array 947 connect four corners of the plate element. This arrangement allows for control over the angle of the plate element relative to the surface below. As the volume and temperature fluctuate in the material of the pillar elements and based on the sensed temperatures of first sensor array 926 and second sensor array 928, gap actuator controller 942 responds by adjusting the four pillar actuators in such a way to maximize near-field radiative heat flux.

Figure 16:
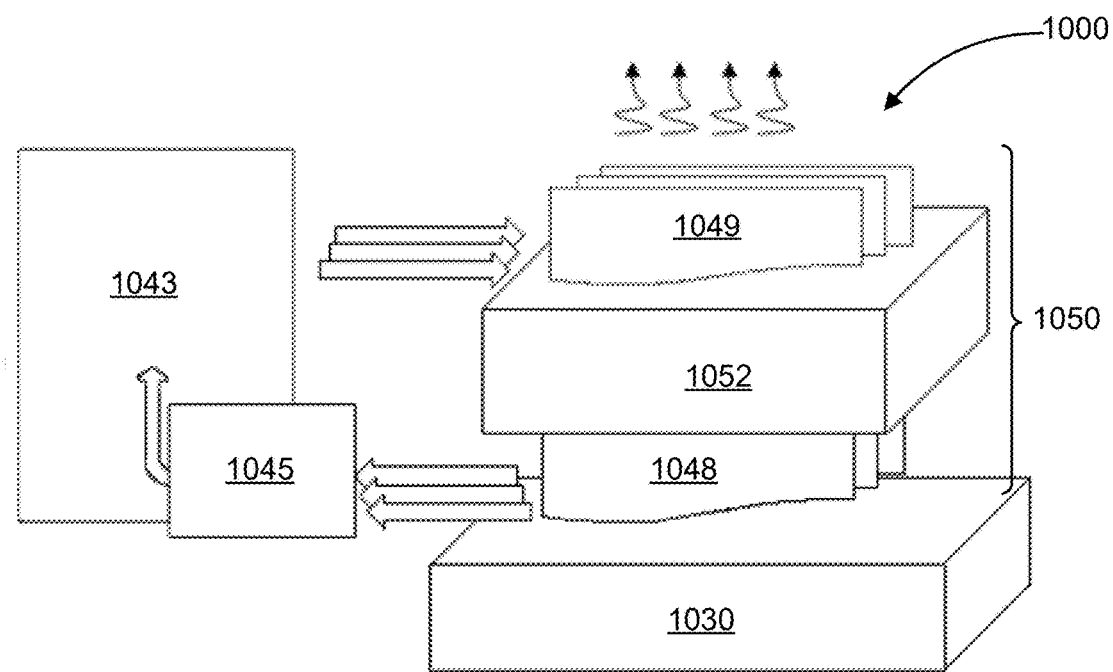
FIG. 16 illustrates a schematic diagram of an active radiative heatsink device according to another embodiment.

FIG. 16 illustrates a schematic diagram of an active radiative heatsink device 1000 according to another embodiment. Active radiator heatsink device 1000 is based on the principles of electroluminescent cooling (ELC). In this embodiment, a single ELC element is referred to as a solid-state emitter (SSE).

In the same way that a solid-state heat pump, such as a thermoelectric cooler (TEC), moves heat through kinetic transfer of energy from the cold side of a device to the hot side of the device, an ELC-based technology aims to pump heat using conversion of thermal energy in a solid-state device to optical energy. A simple ELC device is comparable to highly efficient LEDs or quantum dots being operated with a negative bias voltage. For ELC to occur, the energy of the emitted photons ($E_{out}=hf$) may exceed the energy of the injected charge carriers ($E_{in}=qV$) to the junction, $E_{out} > E_{in}$. For this to make physical sense, the additional energy may come from heat energy (phonon-mediated thermal energy) in the crystal lattice of the semiconductor making up the SSE.

Active radiative heatsink device 1000 includes an active radiator 1050, a sensor array 1046, a grid of SSEs 1049, a bias-voltage controller 1043 and an ELC optimizer 1045. Bias-voltage controller 1043 and ELC optimizer 1045 are configured to provide active fine-grain control of bias voltage as a function of temperature distribution. Controller 1043 provides electrical connectivity and sensor feedback from a grid of temperature sensors to optimizer 1045. Sensor array 1046 is on one side of ELC radiator 1052 and SSE array 1049 is on an opposing side of ELC radiator 1052. Sensor array 1048 is coupled to heat source 1030, measures the temperatures and/or dynamics of emitted GHz, THz or Infrared radiation, at different locations on heat source 1030 and feeds that information to optimizer 1045. Bias-voltage controller 1043 and ELC optimizer 1045 maintain fine-grain control of the bias-voltage applied to individual heat-pumping elements defined by grid of SSE array 1049. Additional control of the frequency of the emitted radiation from SSE array 1049 is also possible.

Figure 17:
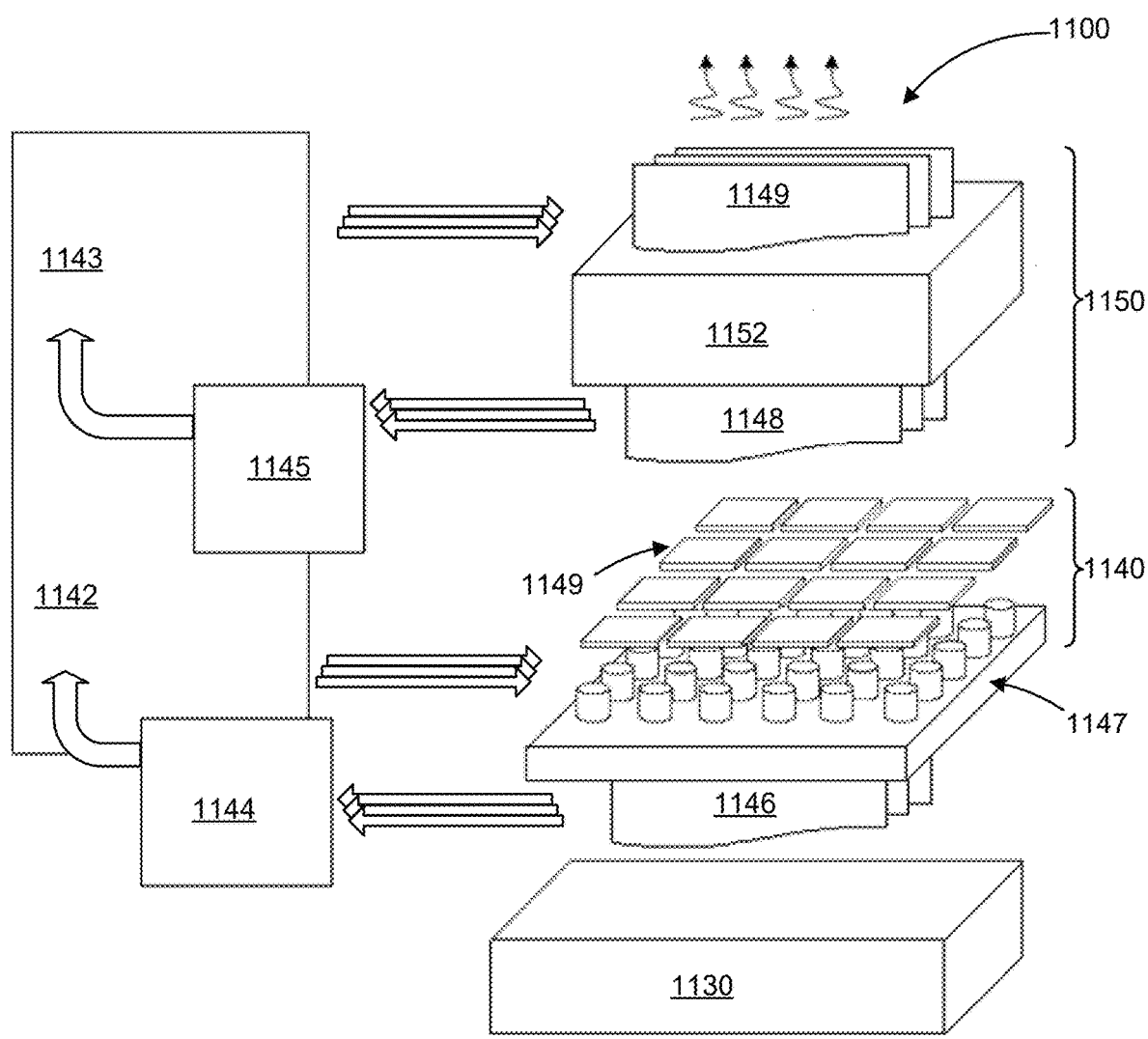
FIG. 17 illustrates a schematic diagram of an active radiative heatsink device according to yet another embodiment.

FIG. 17 illustrates a schematic diagram of an active radiative heatsink device 1100 according to yet another embodiment. In particular, active radiative heatsink device 1100 includes an active radiator 1150, an active cold plate 1140, a gap actuator controller 1142, a NF-RHT optimizer 1144, a bias-voltage controller 1154 and an ELC optimizer 1145. In this embodiment, there are two coupled machine learning models. The near-field model maps the spatial and temporal temperature distribution of heat source 1130 to voltage or current signals to the micro-pillar actuator arrays 1147. The far-field model maps the spatial and temporal temperature distribution of the micro-plate array 1149 to maintain the optimal bias voltage of the ELC emitters for maximal conversion of the near-field radiative heat flux to far-field heat flux. Each of the micro-plate array elements 1149 include a temperature sensor in contact with a substrate, which acts as an isolated passive radiative heatsink, or a powered sub-array of ELC emitters. Further reduction of the intrinsic losses due to conduction through the micro-plate array 1149 to the micro-pillar array 1147 is possible by attaching each actuator 1149 to magnetic elements and constructing the substrate which houses the sub-array of ELC emitters 1149 from a diamagnetic material such that it levitates. This places constraints on the orientation of device 1100 relative to the gravitational field of earth, but because the gap is maintained in vacuum or dielectric, device 1100 has the added benefit of removing all parasitic losses due to conduction. This is important because the cold side of the device 1100 is assumed to be sky-facing (or in contact with an optical channel where the radiation may pass with minimal attenuation such as fiber optic cable) where it acts as the cold-side for the near-field radiative heat flux to be deposited. As the temperature difference between the hot side facing heat source 1130 (e.g., the CPU/GPU, etc.) and the cold side facing the sky, the amount of power which can be dissipated increases linearly. Furthermore, the cold side of the device simultaneously houses ELC emitters 1149, which become far more efficient as they reach cryogenic temperatures. IF the emitters can be thermally isolated from the surrounding environment during operation, they can efficiently pump all of the heat flux being deposited from the near-field thermal radiation into the far-field via electroluminescent cooling. When micro-plate array substrate 1149 is also cooled passively via radiative cooling effects, the efficiency of the active radiation heatsink device 1100 is maximized.

While the above embodiments of passive and active radiative heatsinks pump heat away from a heat source into the electromagnetic spectrum, more detail is needed on how to move thermal radiation from a server device to other locations in a data center for energy recovery and/or how to dissipate thermal radiation to outer space. In order to remove the thermal radiation from an enclosed server having passive and or active radiative heatsinks, it is necessary to provide features in order to remove the emitted power from the enclosure. In one embodiment and as illustrated in the embodiment in FIG. 3, the enclosure includes a window transparent to the wavelength region the radiative heatsink is converting its thermal energy into for line-of-sight transmission. In another embodiment and as illustrated in the embodiment in FIG. 4, an optical fiber coupling mechanism is provided to route the radiation into optical channels embedded into the enclosure. Although FIGS. 3 and 4 illustrate passive radiative heatsinks 100 and 200 located in enclosures 101 and 201, respectively, it should be realized that any of the radiative heatsink embodiments illustrated in FIGS. 6-9, 11-12 and 15-17 may be located within an enclosure, such as enclosures 101 and 201 and will need thermal radiation removed from the enclosure.

In a line-of-sight embodiment, an infrared-window may be included in the enclosure above each device equipped with a radiative heatsink, and/or mirrors and lenses may be added. In both the active and passive embodiments, the infrared windows are transparent to the wavelength range the radiative heat sink converts its kinetic thermal energy as is illustrated in the FIG. 3 enclosed embodiment.

Figure 18:
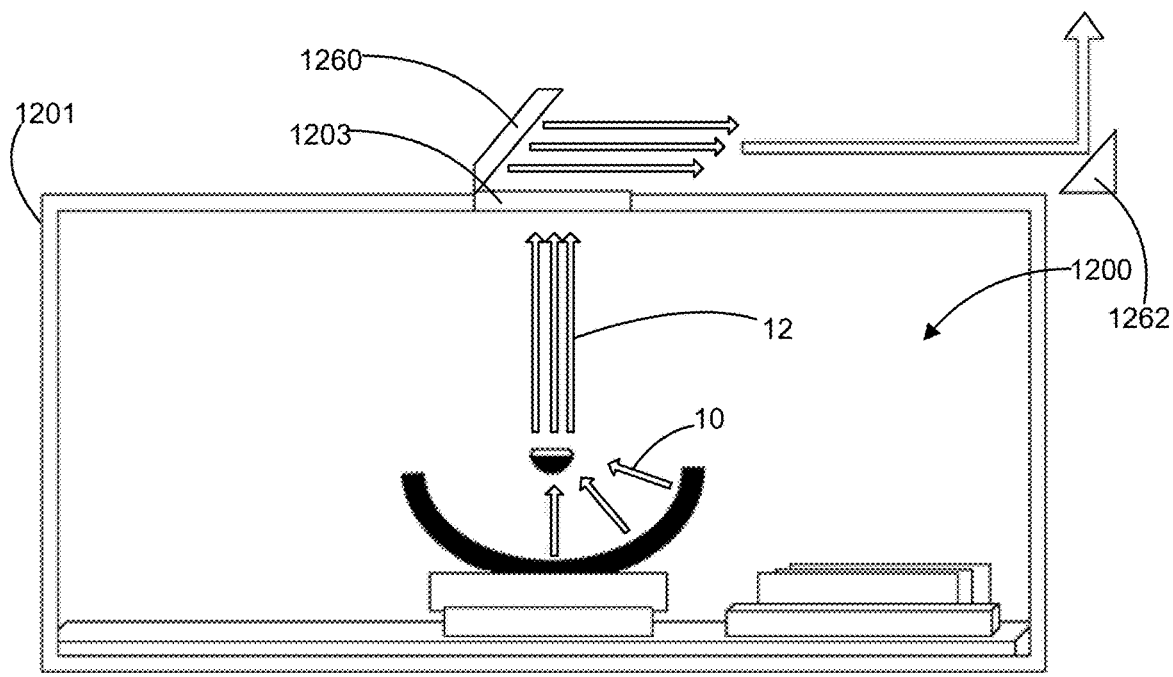
FIG. 18 illustrates an enclosure having a radiative heatsink that utilizes a series of infrared-reflective mirrors to route thermal radiation in a line-of-site configuration according to an embodiment.

FIG. 18 illustrates an enclosure 1201 having a radiative heatsink 1200 that utilizes a series of infrared-reflective mirrors to route thermal radiation in a line-of-site configuration according to an embodiment. As illustrated, thermal radiation 10 is concentrated and collimated into thermal radiation 12 and is emitted through infrared window 1203, reflects off mirror 1260 and mirror 1262. While radiative heatsink 1200 is a type of heatsink that utilizes a radiator having a parabolic fin and a concentrator rod, it should be realized that heatsink 1200 in FIG. 18 may be any of the radiative heatsinks illustrated in FIGS. 6-9, 11-12 and 15-17.

Figure 19:
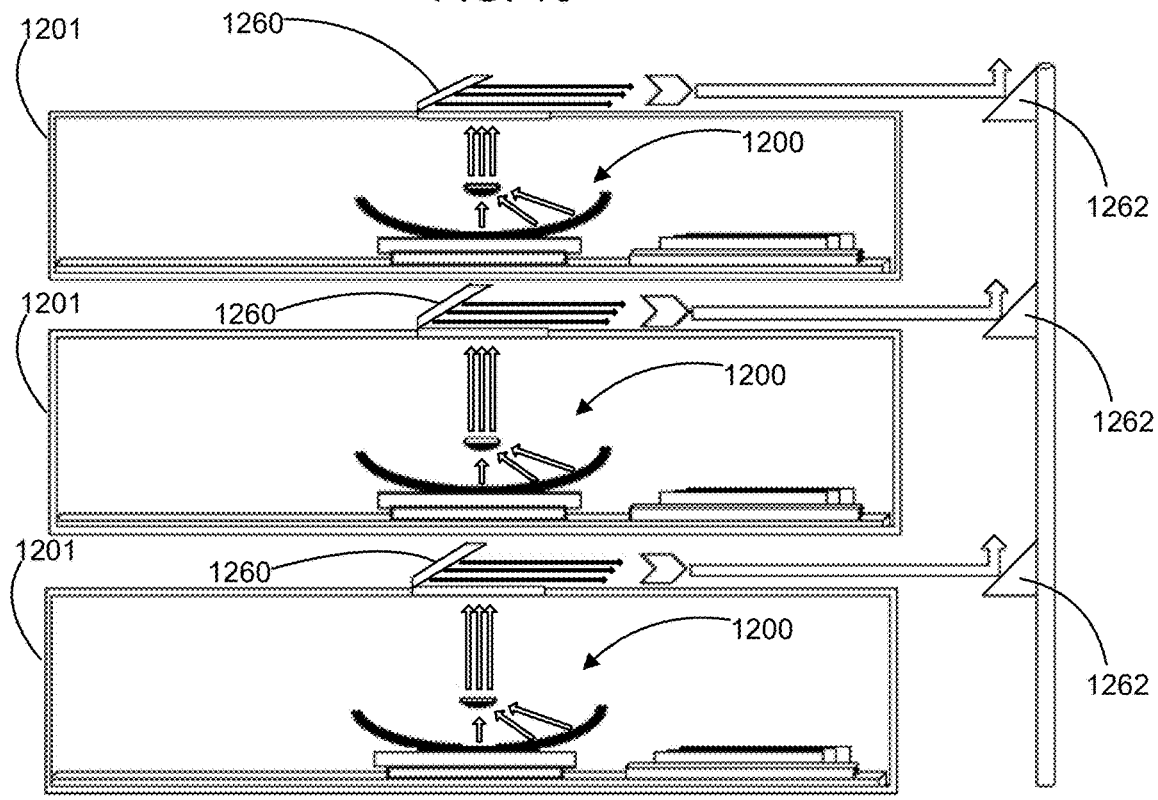
FIG. 19 illustrates a plurality of enclosures each having radiative heatsinks that utilize a series of infrared-reflective mirrors to route thermal radiation in a line-of-sight configuration according to an embodiment.

FIG. 19 illustrates a plurality of enclosures 1201 each having radiative heatsinks 1200 that utilize a series of infrared-reflective mirrors to route thermal radiation in a line-of-sight configuration according to an embodiment. As illustrated, enclosures 1201 and optical components 1203, 1260 and 1262 are stacked within a rack and additional optics route the infrared to a rack level reflector. The collection of all rack-level reflectors are then aggregated together into datacenter-wide collimating lens or directed to an infrared windowed ceiling tile directly above each rack. While radiative heatsinks 1200 are a type of heatsink that utilizes a radiator having a parabolic fin and a concentrator rod, it should be realized that heatsinks 1200 in FIG. 19 may be any of the radiative heatsinks illustrated in FIGS. 6-9, 11-12 and 15-17.

Similarly, optical fibers may replace the line-of-sight optics approach to offer fine-grain control of routed radiated power around obstacles and toward a final end point for dispersion into the sky-facing environment outside of the datacenter, or onto various focal points for energy recovery scenarios.

Figure 20:
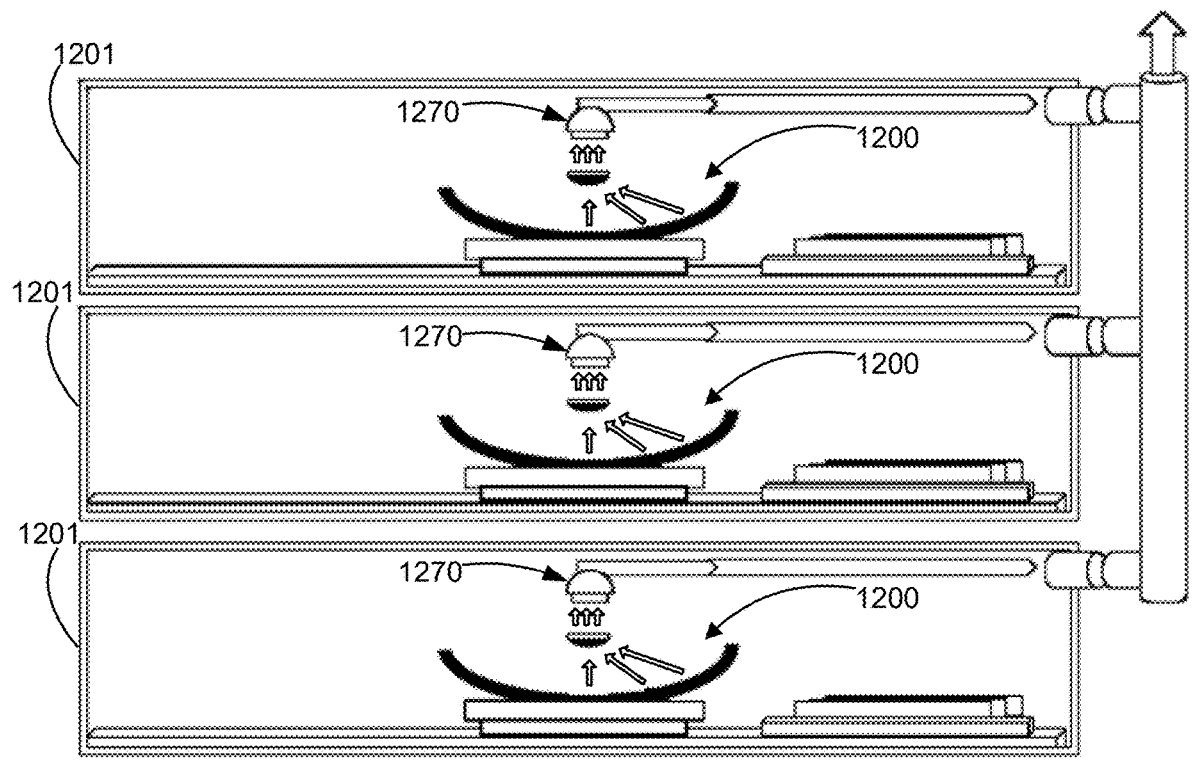
FIG. 20 illustrates a schematic diagram of a plurality of enclosures each having radiative heatsinks that are coupled to an optical-channel enclosure according to an embodiment.

FIG. 20 illustrates a schematic diagram of a plurality of enclosures 1201 each having radiative heatsinks 1200 that are coupled to an optical-channel enclosure according to an embodiment. The key feature of the optical-channel enclosure is an optical-fiber coupling 1270 seated above, or connected to or connected directly to concentrator rod 1208. Coupler 1270 takes advantage of the fact that the radiation emitted is concentrated at a specific point. The coupling mechanism must efficiently focus that radiation, or provide a low loss connection to elements emitting such that the incident radiation can be directed into standard optical fibers with high-transmission of the wavelength region the radiator has been tuned to emit. While radiative heatsinks 1200 illustrated in FIG. 20 are a type of heatsink that utilizes a radiator having a parabolic fin and a concentrator rod, it should be realized that heatsinks 1200 in FIG. 20 may be any of the radiative heatsinks illustrated in FIGS. 6-9, 11-12 and 15-17.

Figure 21:
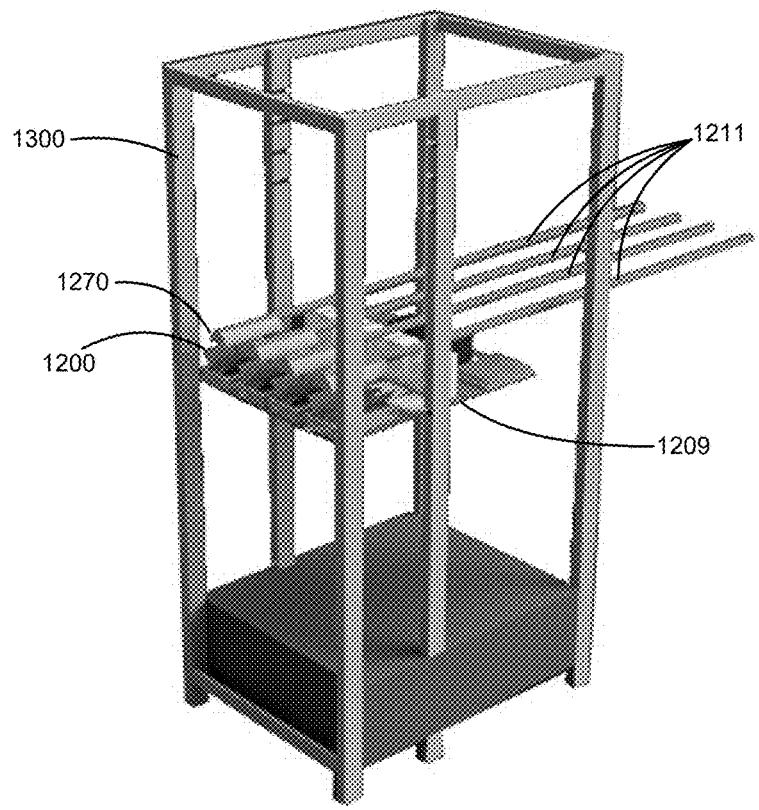
FIGS. 21 and 22 illustrate perspective views of a server rack configured to house a plurality of server casings, not illustrated for purposes of clarity, according to an embodiment.
Figure 22:
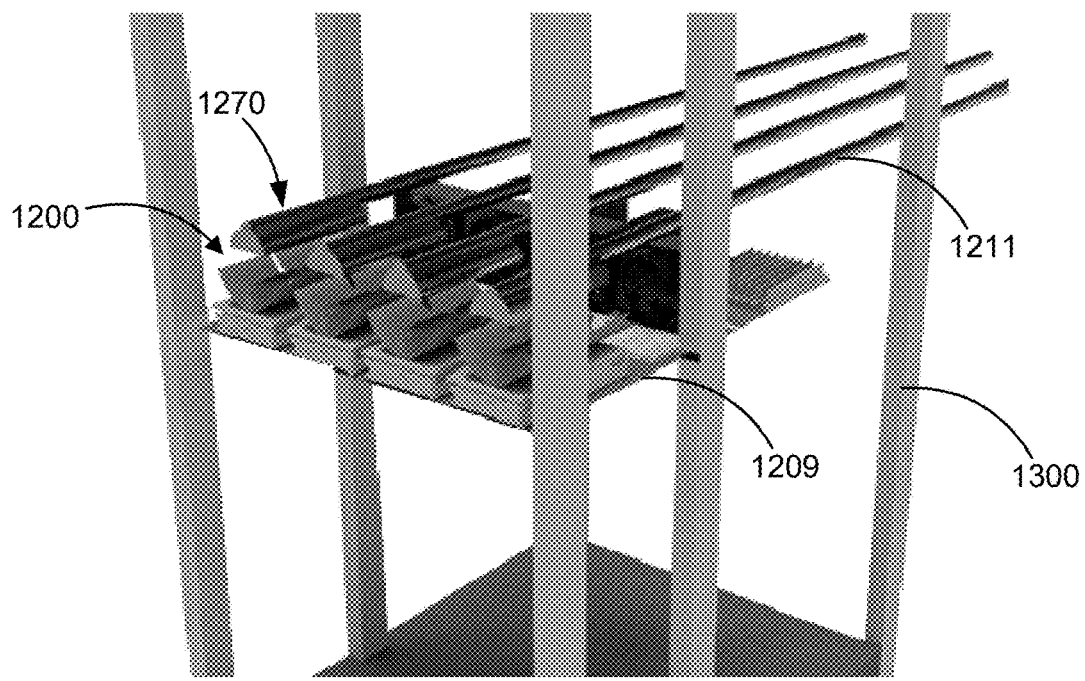

FIGS. 21 and 22 illustrate perspective views of a server rack 1300 that is configured to house a plurality of server casings, not illustrated for purposes of clarity, and according to an embodiment. However, server rack 1300 illustrates a plurality of radiative heatsinks 1200 mounted to a server board 1209 and coupled to optical fiber couplings 1270 that were schematically illustrated in FIG. 20. Optical couplings 1270 are seated above each radiative heatsink 1200. Radiation is directed into fiber optic cabling 1211. The accelerator is typically a GPU or ASIC (application-specific integrated circuit). In FIG. 21, there are four of them and are assumed to be running at approximately 300 Watts each. While radiative heatsinks 1200 illustrated in FIGS. 21 and 22 are a type of heatsink that utilizes a radiator having a parabolic fin and a concentrator rod, it should be realized that heatsinks 1200 in FIGS. 21 and 22 may be any of the radiative heatsinks illustrated in FIGS. 6-9, 11-12 and 15-17.

Figure 23:
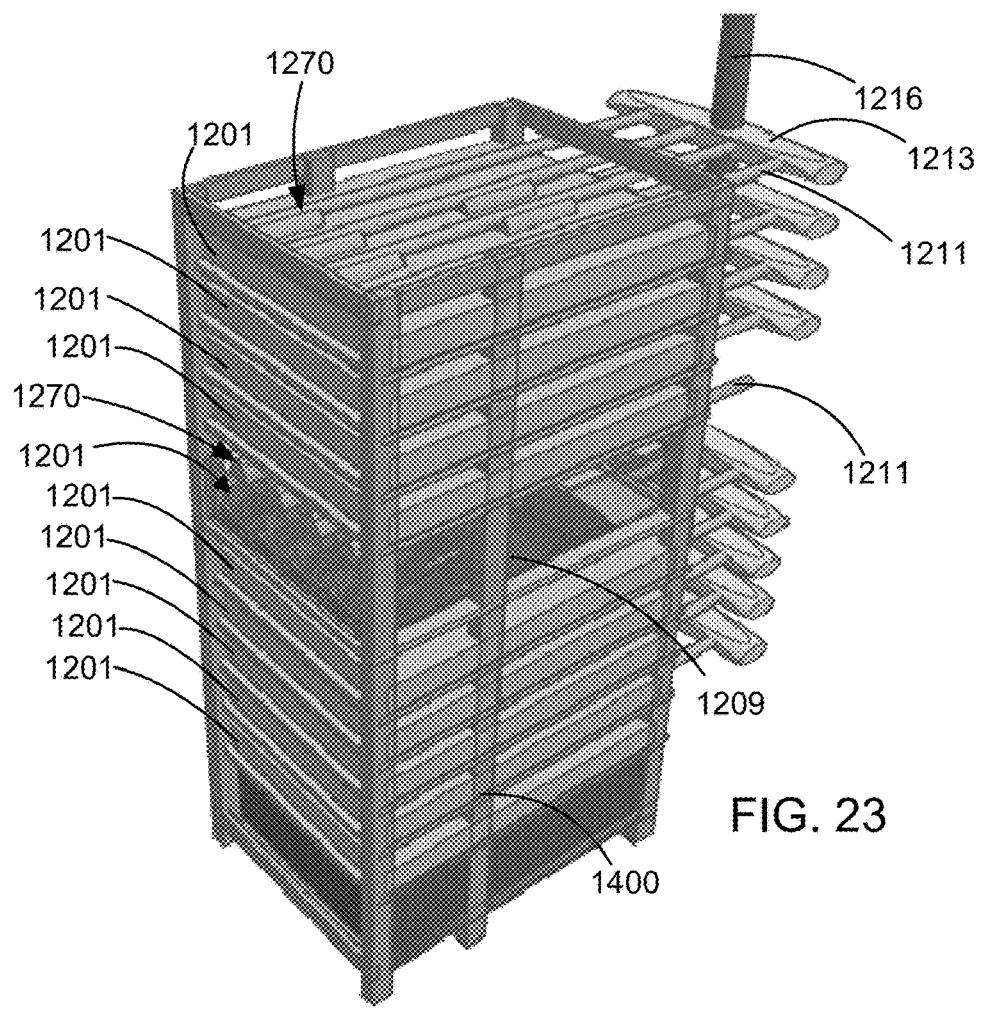
FIG. 23 illustrates a perspective view of the server rack of FIGS. 21 and 22 including a plurality of server casings, with one server casing removed for purposes of clarity, and according to an embodiment.

FIG. 23 illustrates a perspective view of a server rack 1400 that is configured to house a plurality of server casings 1201, each with radiative heatsinks attached to their respective optical couplings, feeding an aggregate optical fiber bundle or light pipe at the rear of the rack with one server casing removed for purposes of clarity, and according to an embodiment. Server rack 1400 illustrates a plurality of radiative heatsinks 1200 inside the missing server casing that are mounted to a server board 1209 and coupled to optical fiber couplings 1270. Radiation is directed into fiber optic cabling 1211 into housings 1213 and then vertically through one or more cables that extend towards a ceiling of the room to which the server rack 1400 is located. Housings 1213 aggregate the bundle of fibers coming off of each of the radiative heatsinks 1200 into a larger bundle, which connects to pipe 1216. While radiative heatsinks 1200 illustrated in FIG. 23 are a type of heatsink that utilizes a radiator having a parabolic fin and a concentrator rod, it should be realized that heatsinks 1200 in FIG. 23 may be any of the radiative heatsinks illustrated in FIGS. 6-9, 11-12 and 15-17.

Figure 24:
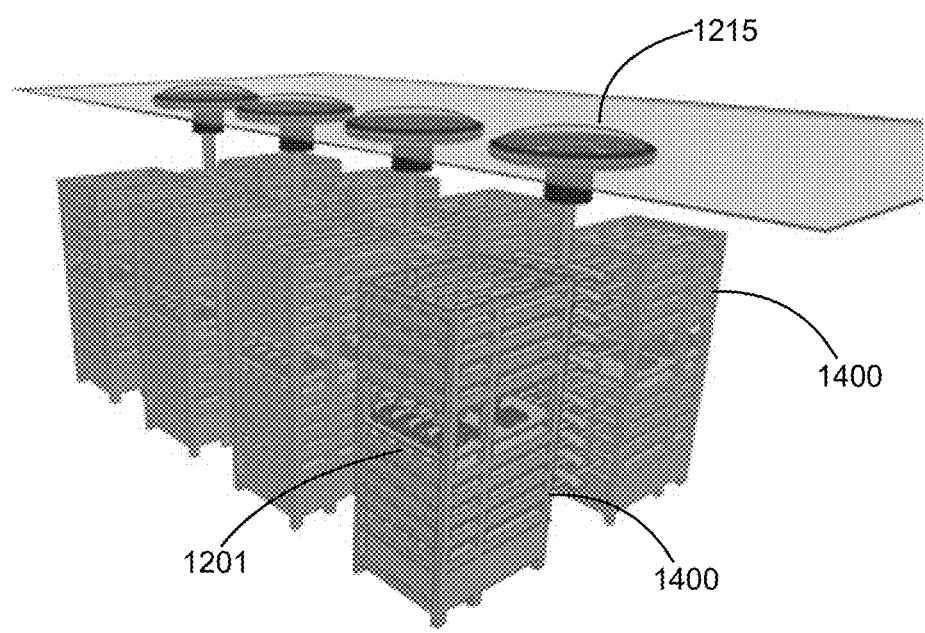
FIG. 24 illustrates a perspective view of a dispersive radiative server room or data center containing a plurality of server racks that are configured to house a plurality of server casings according to an embodiment.

FIG. 24 illustrates a perspective view of a dispersive radiative server room or data center containing a plurality of server racks 1400 that are configured to house a plurality of server casings 1201 according to an embodiment. In FIG. 24, the aggregate radiative power from each server rack 1400 deposits thermal radiation into light pipes or optical fiber bundles which are routed to and attached at the roof collimating lens and facing the sky. Thermal radiation is dispersed via fiber optic cable or line-of-sight optics, through sky-facing infrared windows 1215 (one window above each pair of racks 1400) to be released into outer space. Each window includes a dispersive lens such that the aggregate thermal radiation from each pair of racks 1400 is dispersed from a single lens across 180 degrees of sky. Using dispersive lenses may disperse otherwise high-intensity IR radiation equally across the whole sky. The sky-facing radiative datacenter approach utilizes fiber or line-of-site to achieve sub-ambient temperatures of datacenter devices, such as server devices. The thermal metasurfaces employed on each radiative heatsink are tuned to both concentrate the Infrared emissions into rack-local routing systems (e.g. cable or lenses/mirrors), and simultaneously shift the wavelength regime where peak radiative power is emitted into the atmospheric transparency windows. This requires sky-facing exposure of the emitter to the sky, and can therefore achieve sub-ambient temperatures relative to the local environment. While the radiative heatsinks illustrated in FIG. 24 are a type of heatsink that utilizes a radiator having a parabolic fin and a concentrator rod, it should be realized that the heatsinks illustrated in FIG. 24 may be any of the radiative heatsinks illustrated in FIGS. 6-9, 11-12 and 15-17.

Figure 25:
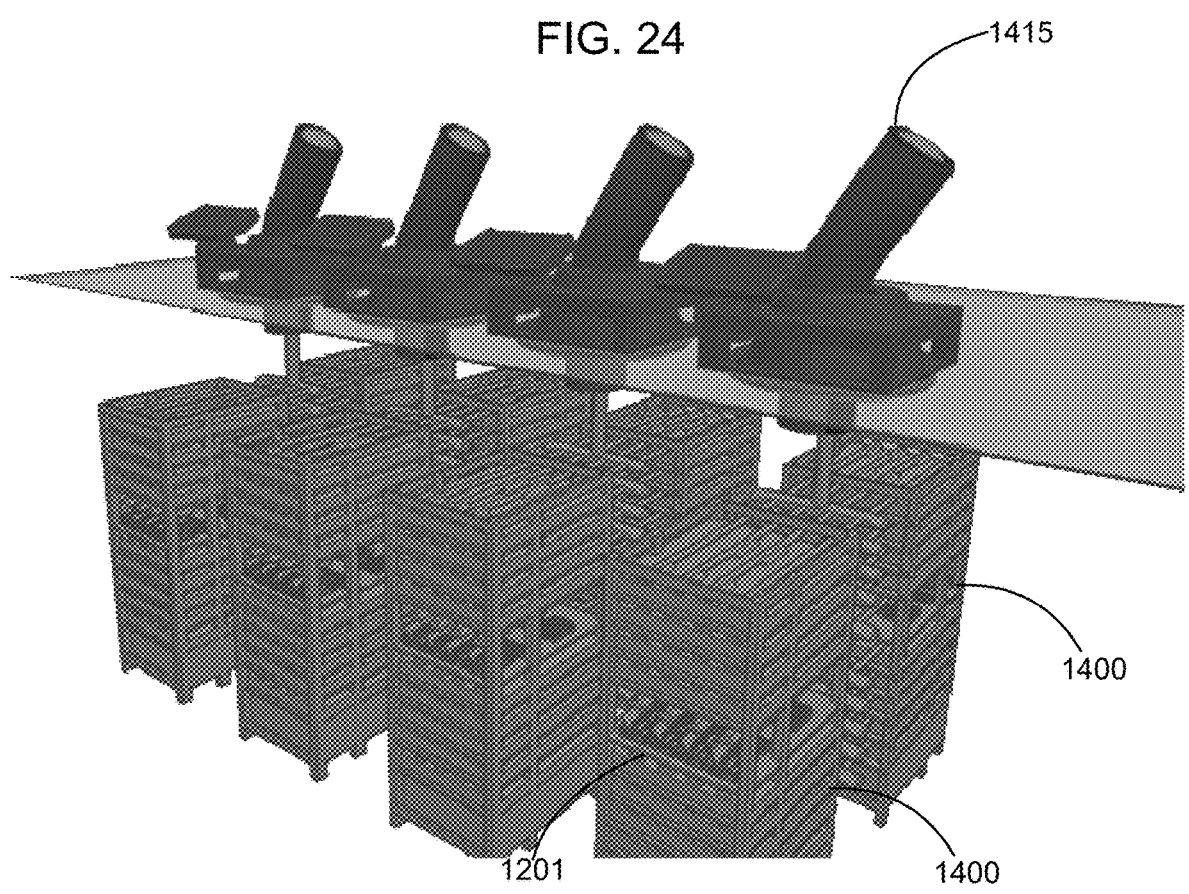
FIG. 25 illustrates a perspective view of an adaptive optics radiative server room or data center containing a plurality of server racks that are configured to house a plurality of server casings according to another embodiment.

FIG. 25 illustrates a perspective view of an adaptive optics radiative server room or data center containing a plurality of server racks 1400 that are configured to house a plurality of server casings 1201 and transmit radiative thermal energy through light pipes or optical fiber bundles which are routed to and attached to the adaptive optical dispersion system which tracks and disperses radiation toward the coldest part of the sky according to an embodiment. In a variation from FIG. 24, in the FIG. 25 embodiment and assuming that the emitted light from the radiative heatsinks is highly coherent, the dispersive lenses are replaced with collimating optics 1415, which may be used to parallelize the radiation and direct it to a single point in the sky with an area proportional to the area of the aperture. If the collimating optics are replaced in a reflective tube or telescoping aperture with the adaptive optics commonly deployed in automated sun-tracking applications (e.g., solar), the aperture can follow the opposite path of the sun and maintain a solar irradiance-free (or reduced) path for the thermal radiation to follow. While the radiative heatsinks illustrated in FIG. 25 are a type of heatsink that utilizes a radiator having a parabolic fin and a concentrator rod, it should be realized that the heatsinks illustrated in FIG. 25 may be any of the radiative heatsinks illustrated in FIGS. 6-9, 11-12 and 15-17.

Figure 26:
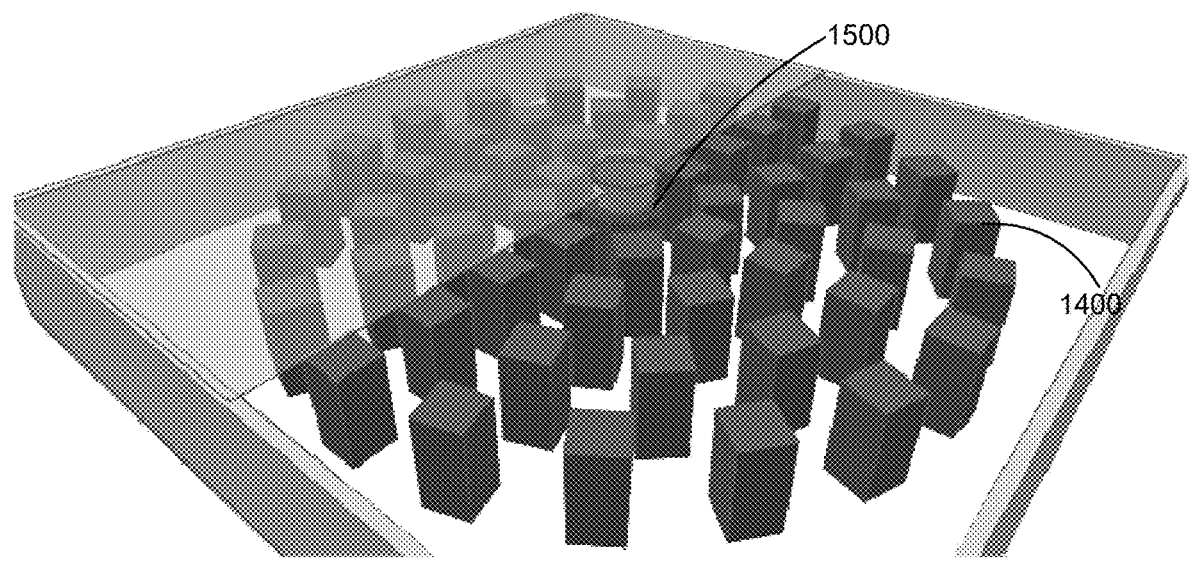
FIG. 26 illustrates a perspective view of an aggregate radiative server room or data center containing a plurality of server racks that are configured to house a plurality of server casings according to another embodiment.

FIG. 26 illustrates a perspective view of an aggregate radiative server room or data center containing a plurality of server racks 1400 that are configured to house a plurality of server casings and route thermal radiation through line-of-sight optics to a focal point at the center of the room, collimating and focusing the radiation to a common point in the sky according to another embodiment. In FIG. 26, the aggregate radiative power from each server is focused onto a data center localized heatsink or thermal reservoir 1500 using line-of-site optics or fiber optic cable, but without requiring explicit sky-facing contact between the emitters and outer space. Instead the focusing-effects enabled by each radiative heatsink can be used to concentrate the Infrared radiation onto a classical dissipation strategy using heatsinks connected to the thermal reservoir of the earth (e.g. fans or liquid cooling radiators). In this form of radiative cooling, the heat is dissipated from each server and rack, and distributed geometrically to focus the emitted radiation onto an arbitrary absorptive surface, which then gets dissipated to the environment. In this form, servers cannot achieve sub-ambient temperatures.

Figure 27:
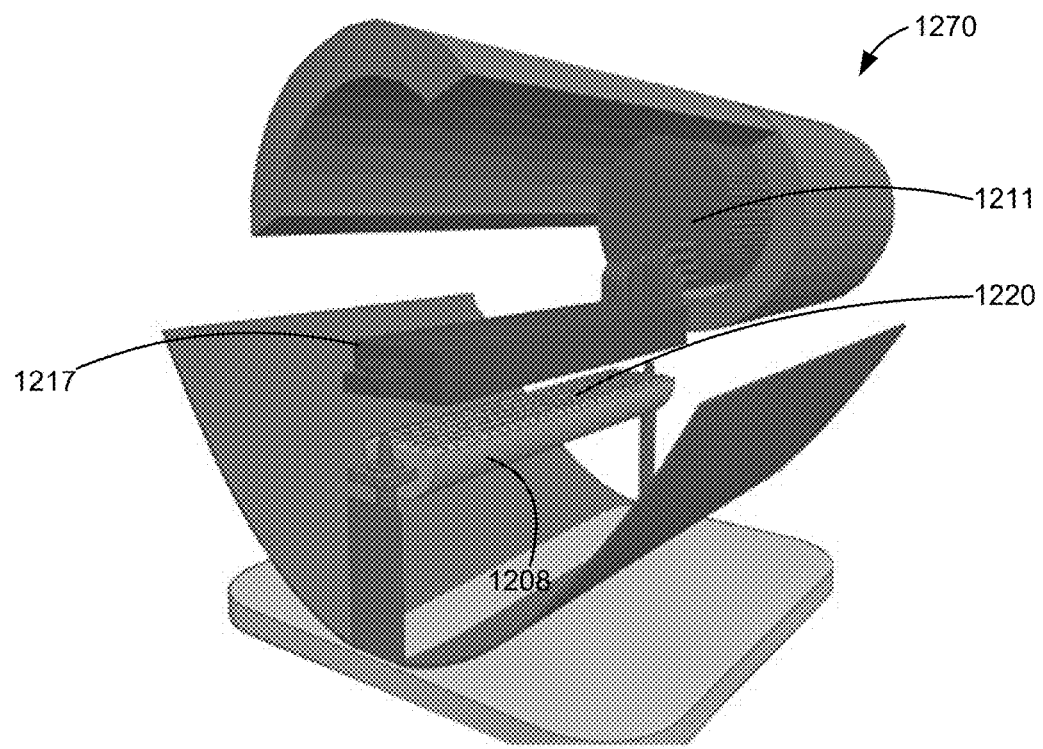
FIG. 27 illustrates an enlarged cutaway view of one optical coupling illustrated in FIGS. 21 and 22 according to an embodiment

FIG. 27 illustrates an enlarged cutaway view of optical coupling 1270 as shown in FIGS. 21 and 22 according to an embodiment. Optical coupling 1270 is coupled to upper planar surface or emitter plane 1220 of concentrator rod 1208 through fiber optics, in-line reflective light pipes, or line-of-site optical routing. The point of optical coupling 1270 is to efficiently transmit, with low transmission losses in the relevant infrared and optical wavelengths, thermal radiation emitted by emitter plane 1220 (having a thermal metasurface) of concentrator rod 1208. In particular, optical coupling 1270 transmits the thermal radiation through the associated cabling or light pipes 1211 and to the environment. After optical coupling is achieved, the routing of the optical energy along the path is relatively arbitrary and constrained only by the layout of a physical datacenter or rack, and the loss of the cable. Depending on the configuration of the opposing end of the pipe or fiber bundle, the way the emitted light at the endpoint may be dispersed across all of the sky, or directed at a single point in the sky. While the radiative heatsink illustrated in FIG. 27 is a type of heatsink that utilizes a radiator having a parabolic fin and a concentrator with a thermal metasurface, it should be realized that the heatsink illustrated in FIG. 27 may be any of the radiative heatsinks illustrated in FIGS. 6-9, 11-12 and 15-17.

Figure 28:
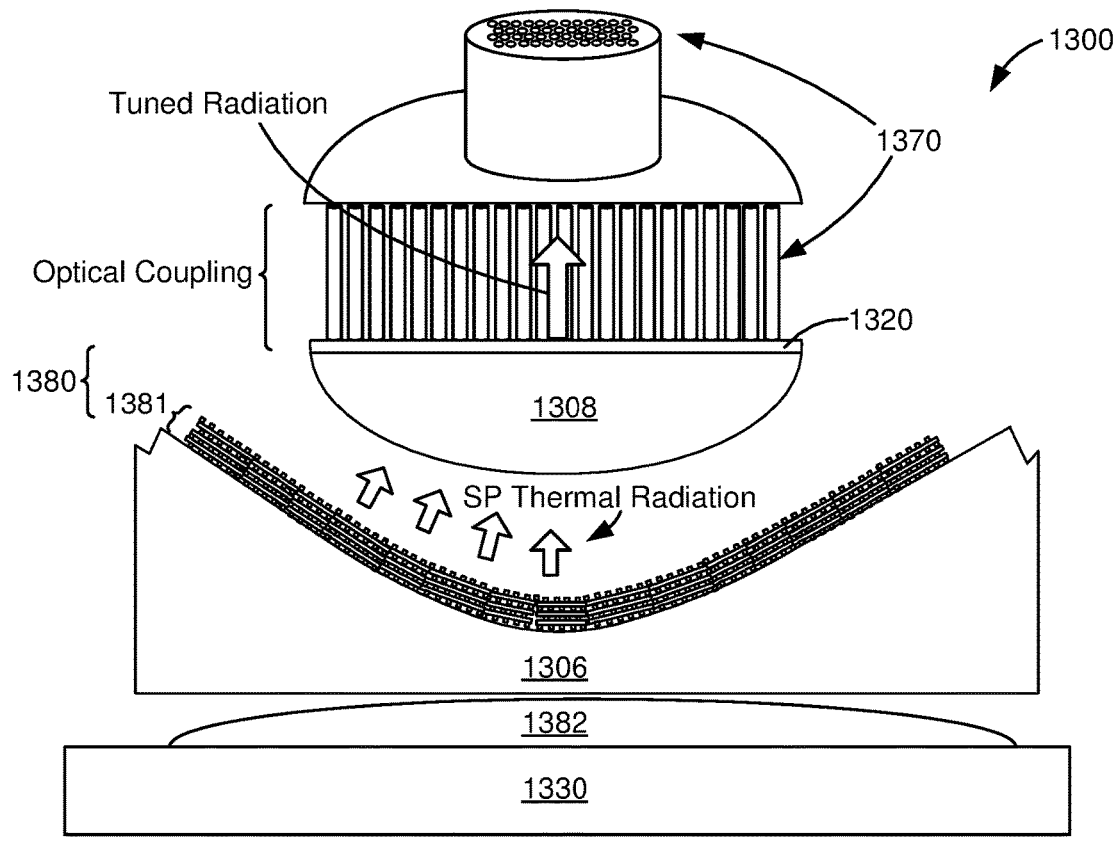
FIG. 28 illustrates a schematic diagram of a passive radiative heatsink device according to an embodiment.

FIG. 28 illustrates a schematic diagram of a passive radiative heatsink 1300 that incorporates a series of super-Planckian photonic crystal (SP-PC) radiators 1381 according to an embodiment. Super-Planckian photonic crystal (SP-PC) radiators 1381 are attached to a parabolic substrate and cold plate 1306 with one concentrator rod or lens 1308 attaching a thermal metasurface 1320 to an optical coupling illustrated in FIGS. 20-23 routing the thermal radiation emitted by SP-PC radiators 1381 into a fiber optic bundle 1370. Radiative heatsink 1300 also includes a super-Planckian (SP) thermal compound 1382 similar to the material or compound 782*b* discussed above.

Radiator 1380 includes a woodpile photonic crystal 1381 mounted on a parabolic surface of cold plate 1306 and a concentrator rod 1308 having a lower portion with a convex-shaped lower surface and an opposing upper portion having upper planar side or emitter plane 1320. Under one embodiment, convex-shaped lower surface of lower portion provides a focal point for super-Planckian thermal radiation (SPTR) leaving photonic crystal to be concentrated. Upper planar side of emitter plane 1320 defines a top of upper portion of concentrator rod 1308 and includes a surface, such as a thermal metasurface, to collimate, focus and tune the concentrated thermal radiation away from the heat source and into fiber optic bundle.

These parameters can be varied such that the large-scale structure of the photonic crystal unit cell can be non-square, having an arbitrary length in either dimension, so long as the number of planks occurring in the respective dimension ($n_x$ or $n_y$) for the layer above or below are adjusted to account for the change in length. The even layers share the component $L_y$, and the odd layers share the component $L_x$. As L gets sufficiently large in either dimension, an angle of curvature, can be used to provide a coarse-grained parabolic curve to the final effective SPP-RHS structure to focus the emitted radiation along one or more axes. In such embodiments, a concentrator rod, or sphere, is used as the focal point for an array of super-Planckian thermal radiation emitting radiative heatsink elements that have been arranged to cover a parabolic substrate (e.g. parabolic fins) or cold plate, and serves as the optical coupling which guides the concentrated incident radiation away from the heat source and to the thermal reservoir provided outside the atmosphere of earth by the cold temperatures of the local universe. In some embodiments, the shape, spacing, material or dopant of the bulk refractory material defining the top-most layer of the PC lattice unit cell may be varied to further enhance the directionality and angle of emission of the thermal photons, or further adjust their amplitude, polarization and phase such that they can be subjected to focusing schema, directed via waveguides, line-of-sight optics, or light pipes to distant locations in the environment.

Figure 29:
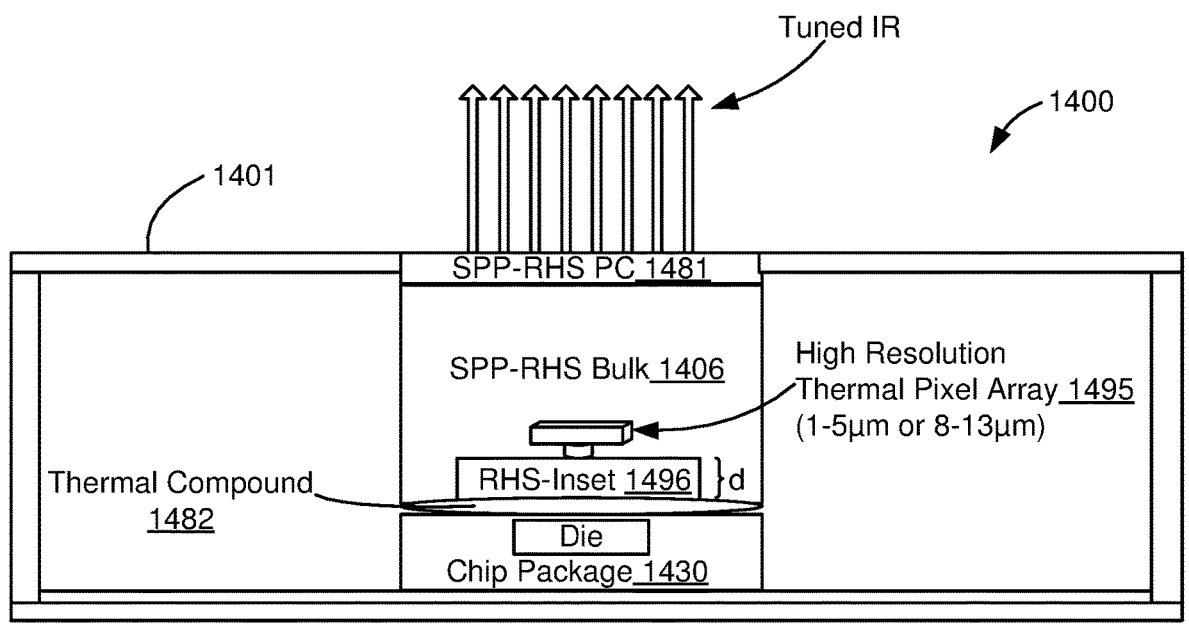
FIG. 29 illustrates a schematic diagram of a server enclosure which contains a passive radiative heatsink device according to an embodiment.

FIG. 29 illustrates a schematic diagram of a server enclosure 1401 which contains a passive radiative heatsink device 1400 according to an embodiment. Passive radiative heatsink device 1400 includes a thermal pixel array 1495 within bulk material of cold plate 1406 to measure or visualize the temperature of heat source (chip package) 1430 through an IR-transparent inset 1496. Radiative heatsink device 1400 further includes a SP-PC 1481 mounted on top of cold plate 1406 and configured to emit SP thermal radiation from the top of server enclosure 1401.

Figure 30:
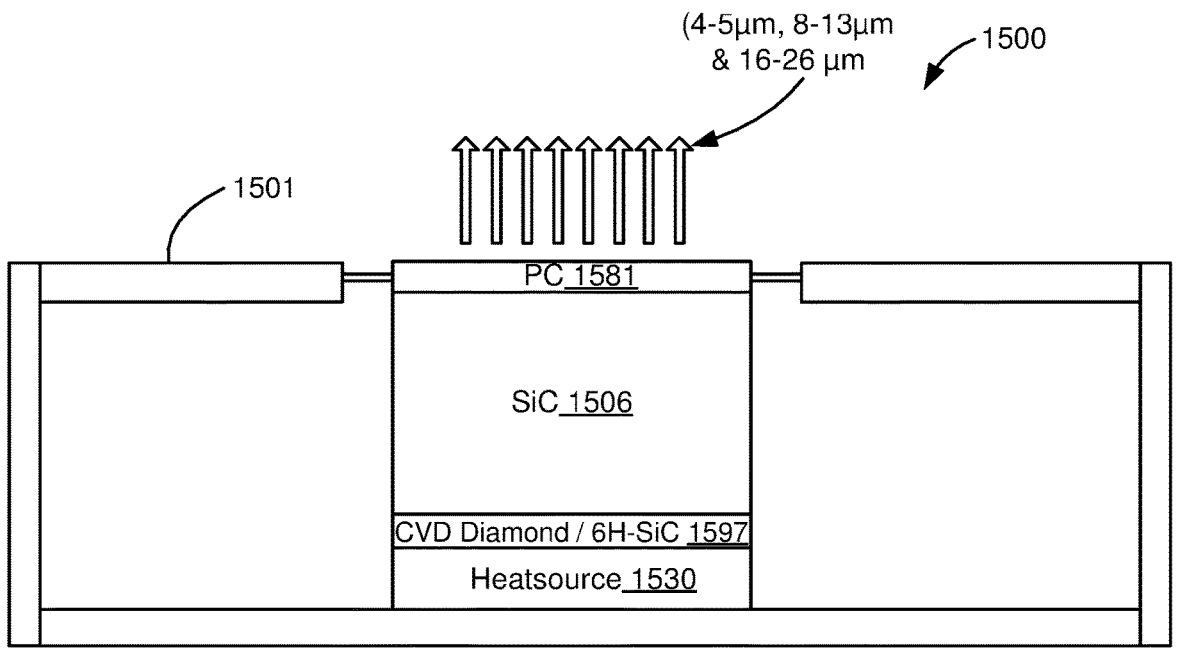
FIG. 30 illustrates a schematic diagram of server enclosure which contains a passive radiative heatsink device according to an embodiment.

FIG. 30 illustrates a schematic diagram of a server enclosure 1501 which contains a passive radiative heatsink device 1500 according to an embodiment. Passive radiative heatsink device 1500 includes a cold plate 1506 made of a bulk material, such as SiC and a SP-PC 1581 mounted on top of cold plate 1506, which emits spatially coherent SPFF (super-Planckian far-field) thermal radiation from the top of server enclosure 1501, and includes a high-thermal conductivity single-crystal layer 1597 at the base of the cold plate.

Figure 31:
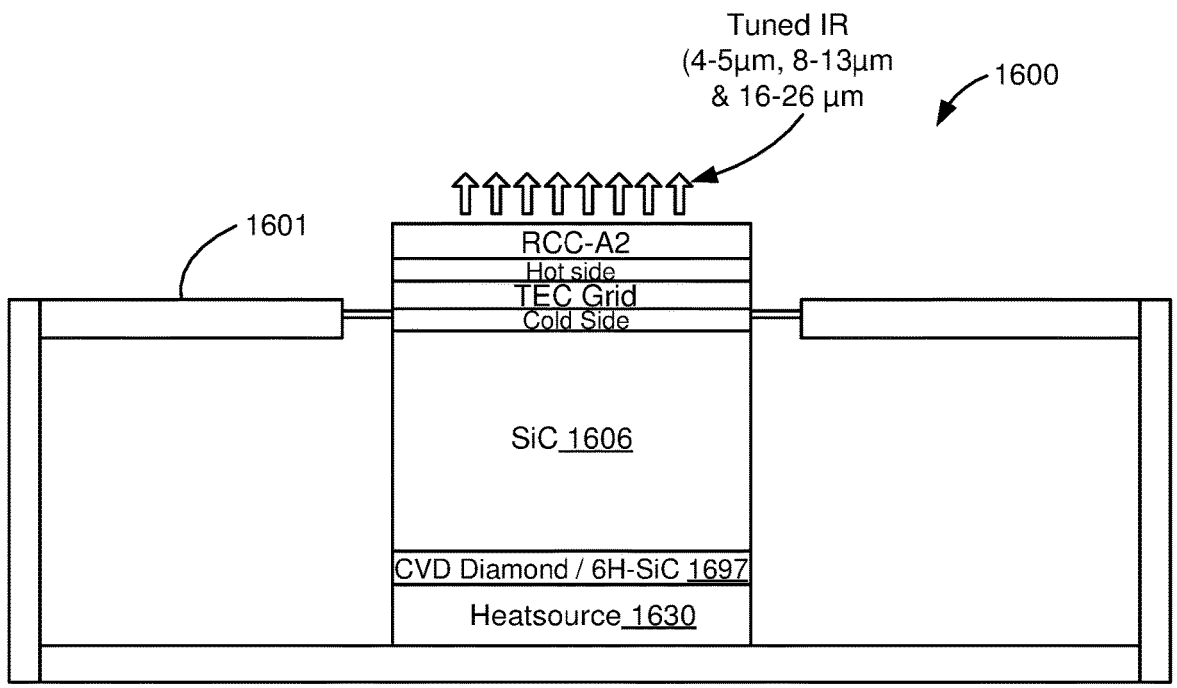
FIG. 31 illustrates a schematic diagram of an active radiative heatsink device according to an embodiment.

FIG. 31 illustrates a schematic diagram of a server enclosure 1601 which contains an active radiative heatsink device 1600 according to an embodiment. Device 1600 includes a thermoelectric (TEC) cooler attached to the bulk material (SiC) of a cold plate 1606, which includes a high-thermal conductivity single-crystal layer 1697 at the base of the cold plate, and a radiator SP-PC emitting spatially coherent, atmospheric window tuned, super-Planckian thermal radiation (SPTR).

Figure 32:
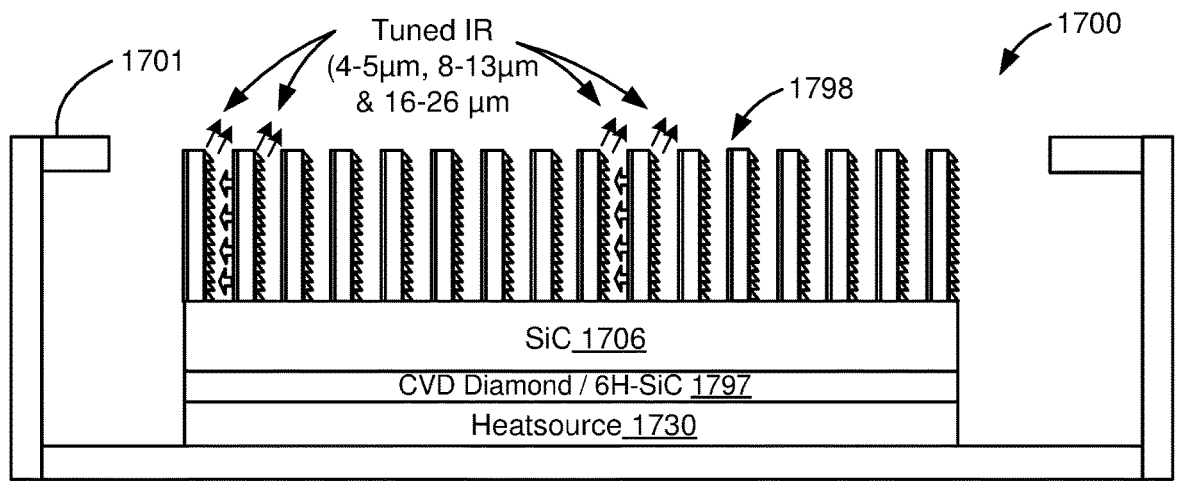
FIG. 32 illustrates a schematic diagram of a passive radiative heatsink according to an embodiment.

FIG. 32 illustrates a schematic diagram of a server enclosure 1701 which contains a passive radiative heatsink device 1700 according to an embodiment. Device 1700 includes with fins 1798 oriented perpendicular to the heat source 1730, attached to a metallic or ceramic cold plate 1706, where the attached fins 1798 are configured to maximize the radiating field-of-view for each fin relative to the sky.

Figure 33:
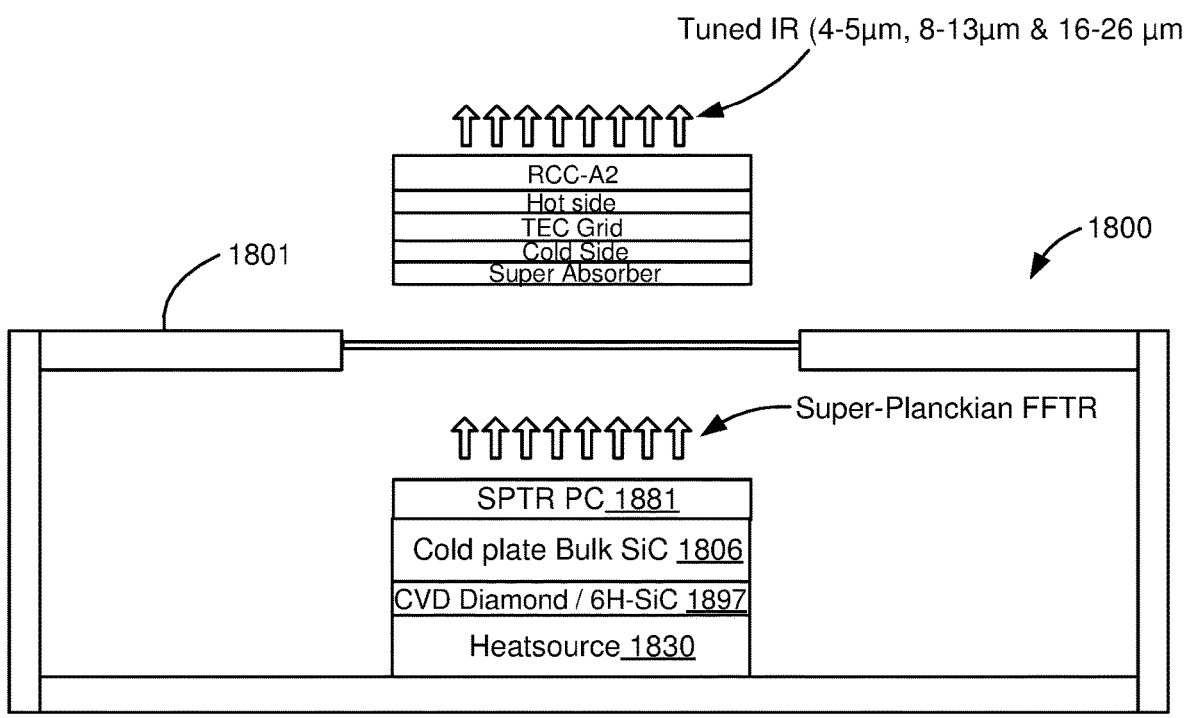
FIG. 33 illustrates a schematic diagram of an active radiative heatsink device according to an embodiment.

FIG. 33 illustrates a schematic diagram of a server enclosure 1801 which contains an active radiative heatsink device 1800 according to an embodiment. Device 1800 radiates broadband super-Planckian thermal radiation (SPTR) to a powered heat exchanger (thermoelectric cooler) with cold reservoir (the cold side of the thermoelectric cooler acts as broadband super-absorber), where the hot side (condenser) of the heat exchanger is cooled passively or through an atmospheric window tuned super-Planckian emitter, such as SPTR photonic crystal (PC) 1881.

Figure 34:
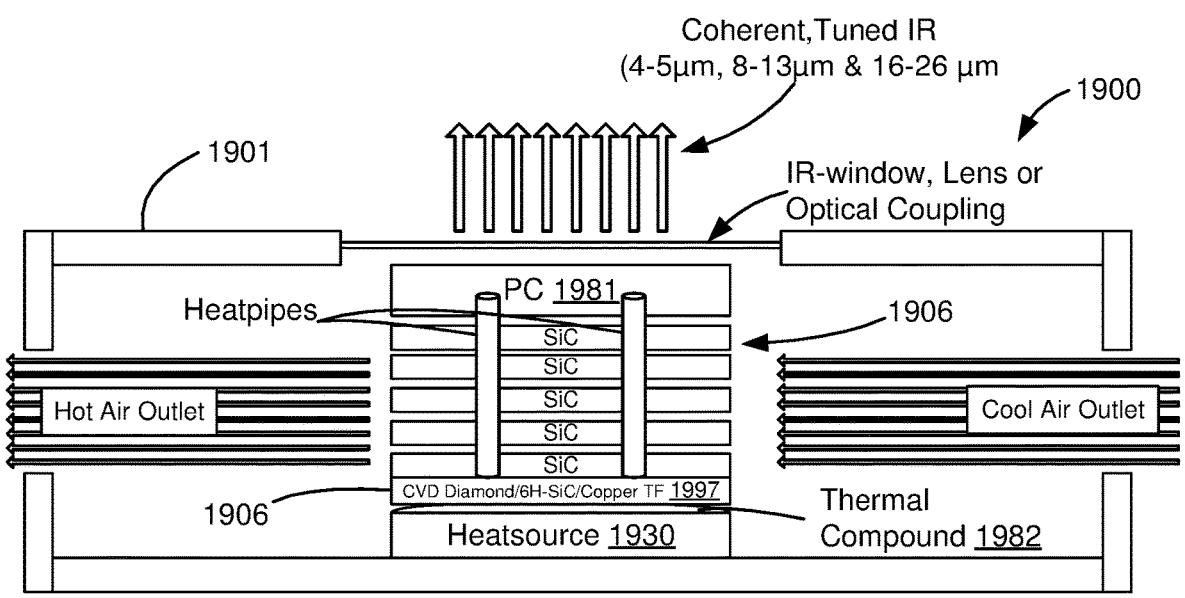
FIG. 34 illustrates a schematic diagram of an active radiative heatsink device according to an embodiment.

FIG. 34 illustrates a schematic diagram of a server enclosure 1901 which contains a passive radiative heatsink device 1900 according to an embodiment. Device 1900 utilizes powered air flow within enclosure 1901 to dissipate heat with convective cooling across a segmented (e.g. finned) cold plate 1906 made with, for example, SiC, where the fins are thermally connected to the base of the cold plate (which includes a high-thermal conductivity single-crystal layer 1997) by heat pipes, and the ends of the heat pipes are connected to a super-Planckian atmospheric window tuned photonic crystal 1981. The emitted radiation is transmitted through a transparent window or lens mounted within enclosure 1901.

Although the present invention has been described with reference to preferred embodiments, workers skilled in the art will recognize that changes may be made in form and detail without departing from the spirit and scope of the invention.

What is claimed is:

1. A radiative heatsink coupled to a heat source comprising:
   a cold plate including a bulk material having a thermal reservoir;
   a radiator mounted to the cold plate, wherein the radiator comprises:
      a concave parabolic fin; and
      a concentrator spaced apart or fitted directly to the concave top surface of the concave parabolic fin and includes a lower convex-shaped side and an opposing upper planar side, wherein the lower convex-shaped side of the concentrator provides a focal point for thermal radiation leaving the concave parabolic fin to be concentrated, or routed to the opposing upper planar side which provides a surface to collimate, focus and tune the concentrated thermal radiation away from the heat source and into an optical coupling; and
   a thermal interface material located between and coupling the heat source to the cold plate, wherein the thermal interface material is configured to convert a portion of a first phononic thermal energy from the heat source into a first photonic near-field thermal radiation and a first photonic far-field thermal radiation and to transfer the first photonic near-field thermal radiation, the first photonic far-field thermal radiation and the remaining of the first phononic thermal energy from the heat source to the bulk material of the cold plate; and
   wherein the bulk material of the cold plate is configured to combine the first photonic near-field thermal radiation, the first photonic far-field thermal radiation and the remaining first phononic thermal energy into a second phononic thermal energy and provide the second phononic thermal energy to the radiator; and wherein the radiator is configured to convert the second phononic thermal energy into a second photonic near-field thermal radiation and a second photonic far-field thermal radiation and emit the second photonic near-field thermal radiation or the second photonic far-field thermal radiation such that the thermal reservoir of the bulk material is continuously regenerated.

2. The radiative heatsink of claim 1, wherein the bulk material of the cold plate comprises a ceramic.

3. The radiative heatsink of claim 1, wherein a surface of the upper planar side of the concentrator comprises a thermal metasurface configured to concentrate the infrared radiation emitted from the parabolic fin and shift its wavelengths of radiation to peak radiative power for emission into at least one of the atmospheric transparency windows.

4. The radiative heatsink of claim 1, wherein the concave parabolic fin comprises a plurality of stacked interacting concave parabolic fins with a focal plane of each fin concentrating coherent thermal radiation onto the fin directly above or a plurality of non-interacting parabolic fins with a focal point of each fin concentrating coherent thermal radiation.

5. The radiative heatsink of claim 1, wherein the radiator comprises a water block having a working fluid inlet and working fluid outlet.

6. The radiative heatsink of claim 1, wherein the radiator comprises a photonic crystal made of a refractory material.

7. The radiative heatsink of claim 6, wherein the photonic crystal comprises a woodpile photonic crystal having a plurality of beams arranged in a woodpile structure, wherein four layers of beams include a unit cell having a diamond lattice symmetry.

8. The radiative heatsink of claim 7, wherein the diamond lattice symmetry is achieved by configuring each beam to have a height that is one-half a distance of a spacing between a center of each beam and a width that is one-third a distance of the spacing between the center of each beam.

9. The radiative heatsink of claim 6, wherein the refractory material of each beam in the photonic crystal comprises tungsten.

10. A radiative heatsink coupled to a heat source comprising:
a radiator configured to emit super-Planckian photonic near-field and far-field thermal radiation from the heat source, the radiator comprising a photonic crystal made of a refractory material including a plurality of beams arranged in a woodpile structure, wherein four layers of beams include a unit cell having a diamond lattice symmetry; and
wherein the radiator is configured to deposit the super-Planckian photonic near-field and the far-field thermal radiation in a working fluid; and
wherein the radiator further comprises a blackbody pump layered between the photonic crystal and a cold plate and configured to act as an ideal blackbody emitter with an ideal thermal conductivity.

11. The radiative heatsink of claim 10, wherein the diamond lattice symmetry of the photonic crystal is achieved by configuring each beam to have a height that is one-half of a distance of a spacing between a center of each beam and a width that is one-third of a distance of the spacing between the center of each beam.

12. The radiative heatsink of claim 11, wherein the refractory material of each beam in the photonic crystal comprises tungsten.

13. The radiative heatsink of claim 10, wherein the radiator further comprises a distributed Bragg reflector (DBR) deposited on top of the photonic crystal.

14. The radiative heatsink of claim 10, further comprising: the cold plate, wherein the cold plate is located between the heat source and the radiator and has a reflector deposited on a bulk material made of ceramic, and wherein the reflector is located on a top side of the cold plate and operates as an ideal reflector across all relevant wavelength bands of atmospheric infrared radiation.

15. The radiative heatsink of claim 10, wherein the working fluid comprises water or gaseous particles making up the background of outer space.

16. A radiative heatsink coupled to a heat source comprising:
a cold plate including a bulk material having a thermal reservoir;
a radiator mounted to the cold plate, the radiator comprising a photonic crystal made of a refractory material including a plurality of beams arranged in a woodpile structure, wherein four layers of beams include a unit cell having a diamond lattice symmetry; and
a thermal compound located between and coupling the heat source to the cold plate, wherein the thermal compound is configured to produce super-Planckian thermal radiation from the heat source to be absorbed and transmitted by the bulk material of the cold plate; and
wherein the radiator is configured to emit super-Planckian near-field and far-field thermal radiation such that the thermal reservoir of the bulk material is continuously regenerated.

17. The radiative heatsink of claim 16, wherein the radiator further comprises a distributed Bragg reflector (DBR) deposited on top of the photonic crystal and a blackbody pump layered between the photonic crystal and the cold plate and configured to act as an ideal blackbody emitter with an ideal thermal conductivity.

18. The radiative heatsink of claim 16, wherein the cold plate further comprises a reflector deposited on the bulk material, wherein the reflector operates as an ideal reflector across all relevant wavelength bands of atmospheric infrared radiation.

19. The radiative heatsink of claim 14, further comprising:
a thermal compound located between the heat source and the cold plate and coupling the heat source to the bulk material of the cold plate, the thermal compound configured to produce super-Planckian thermal radiation to be absorbed and transmitted by the bulk material of the cold plate.

* * * * *